United States Patent
Yuta et al.

(10) Patent No.: US 11,841,380 B2
(45) Date of Patent: Dec. 12, 2023

(54) CONTACT PROBE AND SOCKET FOR TESTING ELECTRICAL COMPONENT

(71) Applicant: Enplas Corporation, Tokyo (JP)

(72) Inventors: Inoue Yuta, Tokyo (JP); Sakamoto Yasuyuki, Tokyo (JP); Miura Akira, Tokyo (JP); Obata Keiji, Tokyo (JP); Komatsu Yasushige, Tokyo (JP)

(73) Assignee: Enplas Corporation, Tokyo (JP)

( * ) Notice: Subject to any disclaimer, the term of this patent is extended or adjusted under 35 U.S.C. 154(b) by 0 days.

(21) Appl. No.: 17/709,817

(22) Filed: Mar. 31, 2022

(65) Prior Publication Data
US 2022/0317153 A1 Oct. 6, 2022

(30) Foreign Application Priority Data

Mar. 31, 2021 (CN) .......................... 202110355114.8
Nov. 9, 2021 (CN) .......................... 202111319070.X

(51) Int. Cl.
*G01R 1/067* (2006.01)
*H05K 1/14* (2006.01)
*H05K 7/10* (2006.01)

(52) U.S. Cl.
CPC ................................ *G01R 1/06722* (2013.01)

(58) Field of Classification Search
CPC ....... H05K 7/1061; H05K 1/14; H05K 7/1069
See application file for complete search history.

(56) References Cited

U.S. PATENT DOCUMENTS

| 7,315,176 B2* | 1/2008 | Nelson | G01R 1/06722 324/755.05 |
| 7,507,110 B1 | 3/2009 | Yin et al. | |
| 2006/0066330 A1* | 3/2006 | Yoshida | G01R 1/06772 324/756.03 |
| 2007/0296436 A1* | 12/2007 | Winter | G01R 1/06733 324/755.05 |

(Continued)

FOREIGN PATENT DOCUMENTS

JP   2013101932   5/2013

*Primary Examiner* — Jermele M Hollington
*Assistant Examiner* — Temilade S Rhodes-Vivour
(74) *Attorney, Agent, or Firm* — Mark Bandy; Rankin Hill & Clark, LLP

(57) ABSTRACT

The embodiments of the present disclosure provide a contact probe and a socket for testing an electrical component. The contact probe includes: a tubular structure in which a receiving cavity is formed, and a contact part for contacting with a terminal of a first electrical component is provided at a first end of the tubular structure; a spring arranged in the receiving cavity; a plunger connected with the tubular structure in a slidable manner, wherein a first end of the plunger is provided with a spring positioning part, which abuts against the spring and is an eccentric structure arranged offset from a central axis of the plunger, a second end of the plunger projects from a second end of the tubular structure. In the contact probe of the embodiment of the present disclosure, by means of setting the spring positioning part as an eccentric structure, the effect of increasing the energized contact load of the contact probe can be achieved, thereby reducing the occurrence of the resistance value of the contact probe being greater than the allowable resistance value, and further improving the reliability of electrical testing of sockets.

15 Claims, 30 Drawing Sheets

(56) References Cited

U.S. PATENT DOCUMENTS

| | | | | |
|---|---|---|---|---|
| 2008/0020623 A1* | 1/2008 | Wooden | ................ | H01R 12/88 |
| | | | | 439/331 |
| 2008/0048702 A1* | 2/2008 | Nagata | ............... | G01R 1/06722 |
| | | | | 324/754.03 |
| 2010/0271061 A1* | 10/2010 | Yamamoto | ......... | G01R 1/06722 |
| | | | | 324/754.03 |

* cited by examiner

CONTACT PROBE AND SOCKET FOR TESTING ELECTRICAL COMPONENT

TECHNICAL FIELD

The present disclosure relates to a contact probe and a socket for testing an electrical component.

BACKGROUND

In the production process of electrical components such as IC (Integrated Circuit) packages, it is necessary to use relevant testing devices to test their electrical performance. Such testing devices typically include a socket that is electrically connected to another electrical component, such as a wiring substrate.

A socket in the related art includes a socket body and a contact probe, wherein a receiving part for receiving a first electrical component is formed on the socket body, and in addition, a probe receiving hole is formed in the socket body, and the contact probe is received in the probe receiving hole. During the electrical testing, the first electrical component is placed in the receiving part, the contact probe is in contact with a terminal of the first electrical component at one end and is in contact with another electrical component (hereinafter referred to as a second electrical component) at the other end, thereby establishing an electrical connection between the first electrical component and the second electrical component.

In order to ensure the accuracy of the electrical testing result, the resistance value of the contact probe is not allowed to exceed an allowable resistance value. Contact probes can be classified into various types according to different loads (hereinafter referred to as loads) applied to the second electrical component by the contact probes during operations. The inventors of the present disclosure found that for those types of contact probes with a relatively small load, the resistance values thereof will increase with the increase of the number of electrical tests. This means that for the types of contact probes with a relatively small load, with the increase of the number of electrical tests, the situation of the resistance value being greater than the allowable resistance value will occur frequently, which will adversely affect the accuracy of the electrical testing result, thereby deteriorating the reliability of electrical testing.

SUMMARY

The embodiments of the present disclosure provide a contact probe and a socket for testing an electrical component, so as to reduce the occurrence of the resistance value of the contact probe being greater than the allowable resistance value, thereby improving the reliability of electrical testing.

An embodiment of a first aspect of the present disclosure provides a contact probe, including:
  a tubular structure inside which a receiving cavity is formed, wherein a contact part for contacting with a terminal of a first electrical component is provided at a first end of the tubular structure;
  a spring arranged in the receiving cavity;
  a plunger connected with the tubular structure in a slidable manner, wherein a first end of the plunger is provided with a spring positioning part, which abuts against the spring and is an eccentric structure arranged offset from a central axis of the plunger, a second end of the plunger projects from a second end of the tubular structure.

The contact probe according to the embodiment of the present disclosure can be applied in a socket for testing an electrical component. The first end of the tubular structure of the contact probe has a contact part, and the second end of the plunger of the contact probe projects from the second end of the tubular structure. When the contact part is in contact with the terminal of the first electrical component and the second end of the plunger is in contact with the second electrical component, an electrical connection can be established between the first electrical component and the second electrical component. Furthermore, the inventors of the present disclosure have found through extensive research works and experimental verifications that the resistance value of the contact probe is related to the energized contact load of the contact probe. When the energized contact load is greater than a certain value, even if the number of electrical tests has been reached a large value, the resistance value of the contact probe will not exceed the allowable resistance value. Based on this, the inventors of the present disclosure are devoted to finding measures to increase the energized contact load of the contact probe, so as to reduce or prevent the occurrence of the resistance value of the contact probe being greater than the allowable resistance value. Finally, after a large number of tests and verifications, it is found that changing the shape of the spring positioning part can have a significant impact on the energized contact load of the contact probe, and the test results show that when the spring positioning part is an eccentric structure arranged offset from the central axis of the plunger (for example, a semicircular cone or semicircular-like cone, a semicircular cylinder or semicircular-like cylinder, etc.), the energized contact load of the contact probe can be significantly increased. That is to say, by means of setting the spring positioning part as an eccentric structure, the effect of increasing the energized contact load of the contact probe can be achieved, thereby reducing the occurrence of the resistance value of the contact probe being greater than the allowable resistance value, and further improving the reliability of electrical testing of sockets.

In addition, the contact probe according to the embodiment of the present disclosure may further have the following additional technical features.

In some embodiments of the present disclosure, the eccentric structure is a semicircular cone or a semicircular-like cone.

In some embodiments of the present disclosure, the semicircular cone has a first side surface and a second side surface intersecting with the first side surface, wherein the first side surface is a conical surface, the second side surface is planar, and the second side surface coincides with a longitudinal section of the plunger.

In some embodiments of the present disclosure, the semicircular-like cone has a third side surface and a fourth side surface intersecting with the third side surface, wherein the third side surface is a conical surface, and the fourth side surface does not coincide with a longitudinal section of the plunger.

In some embodiments of the present disclosure, the fourth side surface is planar and is parallel to the longitudinal section of the plunger, and the semicircular-like cone is a structure formed by cutting off more than ½ of a volume from a complete cone in a longitudinal direction.

In some embodiments of the present disclosure, the fourth side surface is planar, an included angle is formed between a plane where the fourth side surface is located and the longitudinal section of the plunger, the semicircular-like cone is a structure formed by cutting off more than ½ of a volume from a complete cone in a direction inclined with respect to a longitudinal direction, and an included angle between the fourth side surface and an end surface of the plunger is an acute angle.

In some embodiments of the present disclosure, the included angle is greater than or equal to 5°.

In some embodiments of the present disclosure, the included angle is greater than or equal to 10°.

In some embodiments of the present disclosure, the fourth side surface is planar, an included angle is formed between a plane where the fourth side surface is located and the longitudinal section of the plunger, the semicircular-like cone is a structure formed by cutting off less than ½ of a volume from a complete cone in a direction inclined with respect to a longitudinal direction, and an included angle between the fourth side surface and an end surface of the plunger is an obtuse angle.

In some embodiments of the present disclosure, the fourth side surface is a spherical surface, a convex surface of which faces towards the third side surface, and the semicircular-like cone is a structure formed by cutting off more than ½ of a volume from a complete cone through the spherical surface.

In some embodiments of the present disclosure, the fourth side surface is a spherical surface, a concave surface of which faces towards the third side surface, and the semicircular-like cone is a structure formed by cutting off more than ½ of a volume from a complete cone through the spherical surface.

In some embodiments of the present disclosure, the eccentric structure is a semicircular cylinder or a semicircular-like cylinder.

In some embodiments of the present disclosure, the semicircular-like cylinder is a structure formed by cutting off more than ½ of a volume from a complete cylinder in a longitudinal direction.

In some embodiments of the present disclosure, the semicircular-like cylinder is a structure formed by cutting off less than ½ of a volume from a complete cylinder in a longitudinal direction.

In some embodiments of the present disclosure, the eccentric structure comprises a first segment and a second segment, wherein the first segment is a semicircular cylinder, and the second segment is a semicircular-like cylinder formed by cutting off more than ½ of a volume from a complete cylinder.

In some embodiments of the present disclosure, the eccentric structure is a quarter cone.

In some embodiments of the present disclosure, a spring baffle is provided on an inner wall of the receiving cavity, and a first end of the spring abuts against the spring baffle, a second end of the spring abuts against the spring positioning part.

In some embodiments of the present disclosure, the second end of the tubular structure is formed with a through hole for the plunger to pass through, the first end of the plunger is formed with an expanded part, and an outer diameter of the expanded part is greater than a diameter of the through hole.

A second aspect of the embodiment of the present disclosure provides a socket for testing an electrical component, including:

a socket body, in which a probe receiving hole is provided;

a contact probe of any one of the above embodiments, which is provided in the probe receiving hole.

According to the socket for testing an electrical component according to the embodiment of the present disclosure, by means of setting the spring positioning part as an eccentric structure, the effect of increasing the energized contact load of the contact probe can be significantly achieved, thereby reducing the occurrence of the resistance value of the contact probe being greater than the allowable resistance value, and further improving the reliability of electrical testing of sockets.

BRIEF DESCRIPTION OF THE DRAWINGS

In order to explain the technical solutions of embodiments of the present disclosure or of the prior art, the drawings required in the description of the embodiments of the present disclosure and of the prior art will be briefly introduced. Apparently, the drawings described below show merely some embodiments of the present disclosure, and a person of ordinary skill in the art can obtain other drawings from these drawings without creative efforts.

DETAILED DESCRIPTION

Figure 1:
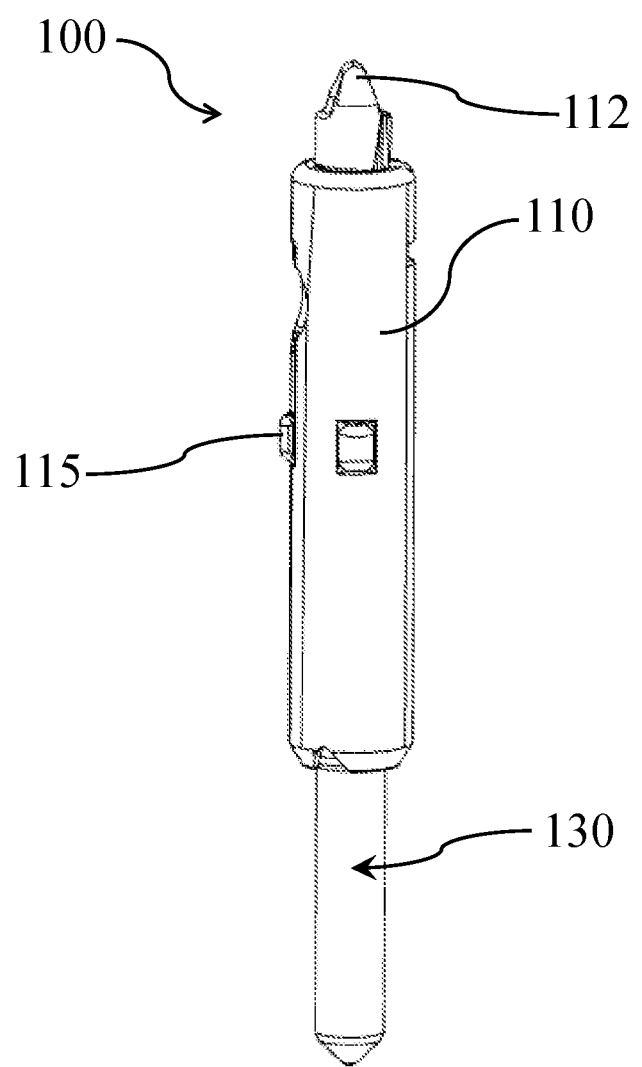
FIG. 1 is a schematic structural diagram of a contact probe according to an embodiment of the present disclosure.

The technical solutions in the embodiments of the present disclosure will be clearly and fully described with reference to the drawings in the embodiments of the present disclosure. Obviously, the described embodiments are only some instead of all of the embodiments of the present disclosure. All other embodiments obtained by those skilled in the art based on the embodiments in the present application fall into the protection scope of the present disclosure.

As shown in FIGS. 1-3, 6, 9, 13, 15, 17, 19, 21, 23, 25 and 28, an embodiment in the first aspect of the present disclosure provides a contact probe 100. The contact probe 100 includes a tubular structure 110, a spring 120 and a plunger 130. Specifically, a receiving cavity 111 is formed inside the tubular structure 110, and a contact part 112 for contacting with a terminal of a first electrical component is provided at the first end of the tubular structure 110. A spring 120 is arranged in the receiving cavity 111, and the plunger 130 is connected with the tubular structure 110 in a slidable manner. The first end of the plunger 130 is provided with a spring positioning part 131, which abuts against the spring 120. The spring positioning part 131 is an eccentric structure arranged offset from the central axis of the plunger, the second end of the plunger 130 projects from the second end of the tubular structure 110.

The contact probe 100 according to the embodiment of the present disclosure can be applied in a socket for testing an electrical component. The first end of the tubular structure 110 of the contact probe 100 is provided with a contact part 112, and the second end of the plunger 130 of the contact probe 100 projects from the second end of the tubular structure 110. When the contact part 112 is in contact with the terminal of the first electrical component and the second end of the plunger 130 is in contact with the second electrical component 300 (please refer to FIG. 13), an electrical connection can be established between the first electrical component and the second electrical component 300 (e.g., a wiring substrate).

Furthermore, the inventors of the present disclosure have found through extensive researches and experimental verifications that the resistance value of the contact probe 100 is related to the energized contact load of the contact probe 100. When the energized contact load is greater than a certain value, even if the number of electrical tests has reached a large value (such as 100,000), the resistance value of the contact probe 100 will not exceed an allowable resistance value. Based on this, the inventors of the present disclosure are devoted to finding measures to increase the energized contact load of the contact probe 100, so as to reduce or prevent the occurrence of the resistance value of the contact probe 100 being greater than the allowable resistance value. Finally, after a large number of tests and verifications, it is found that changing the shape of the spring positioning part 131 can have a significant impact on the energized contact load of the contact probe 100, and the test result shows that when the spring positioning part 131 is an eccentric structure arranged offset from the central axis of the plunger (for example, a semicircular cone or a semicircular-like cone, a semicircular cylinder or a semicircular-like cylinder, etc.), the energized contact load of the contact probe 100 can be significantly increased (compared to the existing spring positioning part using a contact probe with a circular cone structure). That is to say, by means of setting the spring positioning part 131 as an eccentric structure, the effect of increasing the energized contact load of the contact probe 100 can be achieved, thereby reducing the occurrence of the resistance value of the contact probe 100 being greater than the allowable resistance value, and further improving the reliability of electrical testing of sockets.

The energized contact load of the contact probe 100 refers to a force applied by the plunger 130 on a side wall of the tubular structure 110 when the first electrical component is electrically connected to the second electrical component 300 through the contact probe 100. When the spring positioning part 131 is an eccentric structure, the spring will bend significantly during the compression process, so that a part of the spring is closely abutted against the side wall of the tubular structure 110, thereby increasing the energized contact load of the contact probe 100.

It can be understood that the tubular structure 110, the spring 120 and the plunger 130 are all made of electrically conductive metal material, so that the contact probe 100 is electrically conductive and an electrical connection can be established between the first electrical component and the second electrical component 300 using the contact probe 100.

In some embodiments of the present disclosure, as shown in FIGS. 3-18, the eccentric structure is a semicircular cone or a semicircular-like cone. The inventors have found through tests and verifications that when the eccentric structure is a semicircular cone or a semicircular-like cone, the energized contact load of the contact probe 100 will be increased.

Figure 3:
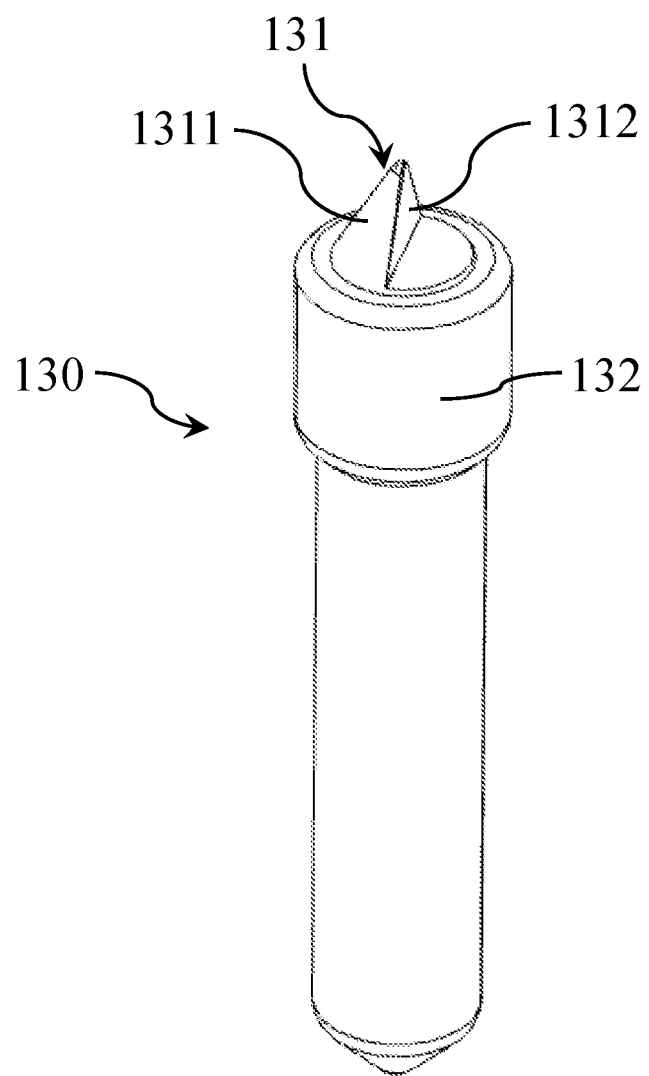
FIG. 3 is a schematic structural diagram of a plunger according to some embodiments of the present disclosure (a spring positioning part is a semicircular cone)
Figure 4:
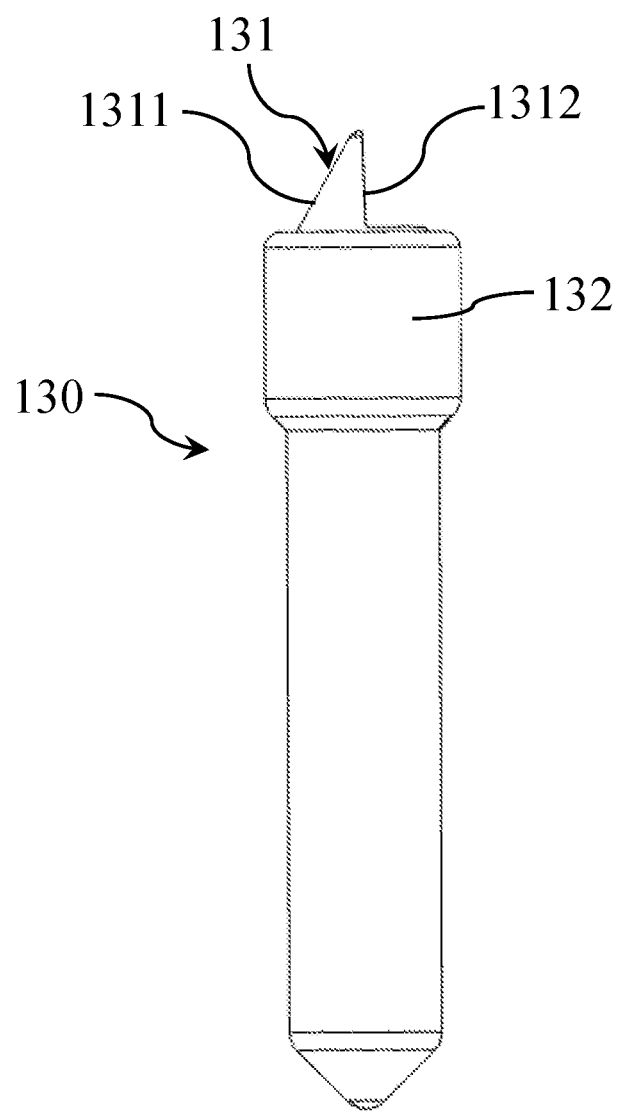
FIG. 4 is a schematic front view of the plunger shown in FIG. 3.
Figure 5:
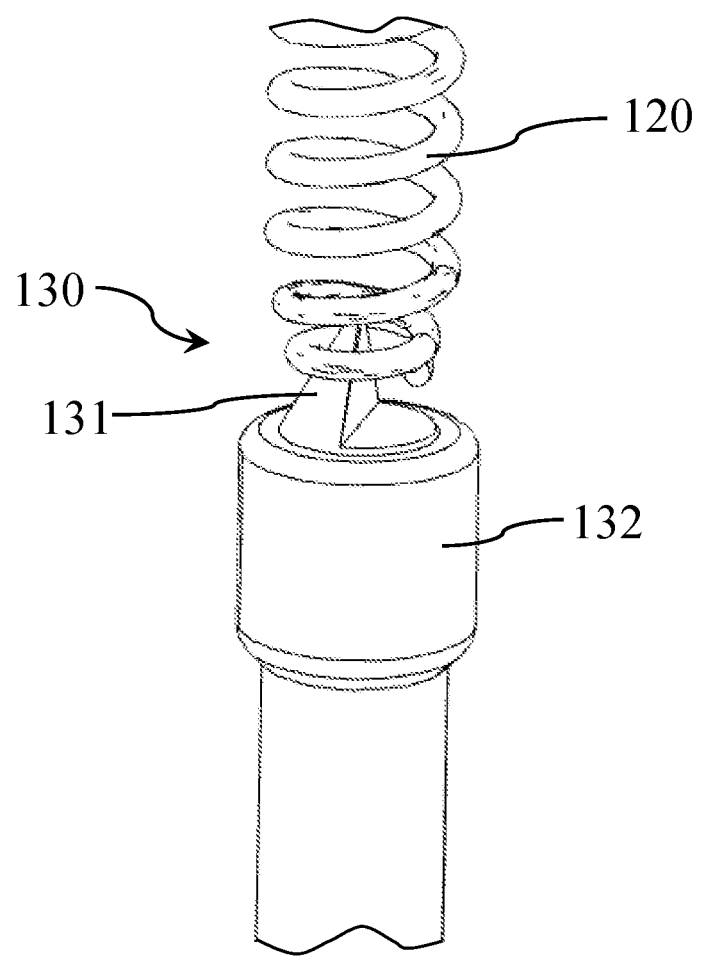
FIG. 5 is a schematic diagram illustrating the installation relationship between the plunger and the spring shown in FIG. 3.

In some embodiments of the present disclosure, as shown in FIGS. 3 to 5, the semicircular cone has a first side surface 1311 and a second side surface 1312 intersecting with the first side surface 1311, wherein the first side surface 1311 is a conical surface, the second side surface 1312 is planar, and the second side surface 1312 coincides with a longitudinal section (an imaginary plane passing through the central axis of the plunger 130) of the plunger 130. In this embodiment, the second side surface 1312 of the semicircular cone coincides with the longitudinal section of the plunger 130, it can be seen that the volume of the semicircular cone is exactly ½ of the volume of a complete cone, that is to say, it can be considered that the semicircular cone is a structure formed by cutting off a half of a complete cone along the longitudinal section (which may be the longitudinal section of the cone or the longitudinal section of the plunger 130). The inventors of the present disclosure have found through a large number of tests and verifications that when the spring positioning part 131 is a semicircular cone, the energized contact load of the contact probe 100 is significantly increased. It is found through tests that for a contact probe 100 with a relatively small load, setting the spring positioning part 131 as a semicircular cone can increase the energized contact load of the contact probe 100 to 1.1 to 1.5 times (compared to the spring positioning part with a circular cone structure). In this case, the occurrence of the resistance value of the contact probe 100 being greater than an allowable resistance value can be greatly reduced.

In some embodiments of the present disclosure, as shown in FIGS. 6 to 12, the semicircular-like cone has a third side surface 1313 and a fourth side surface 1314 intersecting with the third side surface 1313, wherein the third side surface 1313 is a conical surface, the fourth side surface 1314 is a planar or a curved surface (e.g., a spherical surface), and the fourth side surface does not coincide with the longitudinal section of the plunger 130. It can be seen that the semicircular-like cone in this embodiment is similar to the semicircular cone in shape, but the two are not exactly the same.

Figure 6:
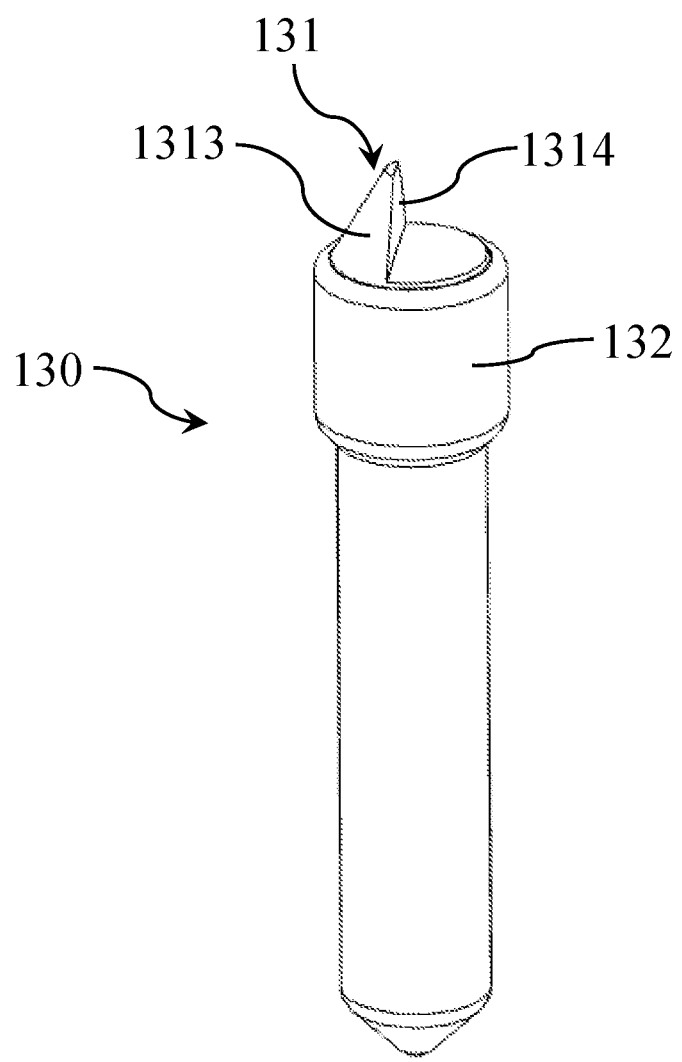
FIG. 6 is a schematic structural diagram of a plunger according to other embodiments of the present disclosure (the spring positioning part is a semicircular-like cone)
Figure 7:
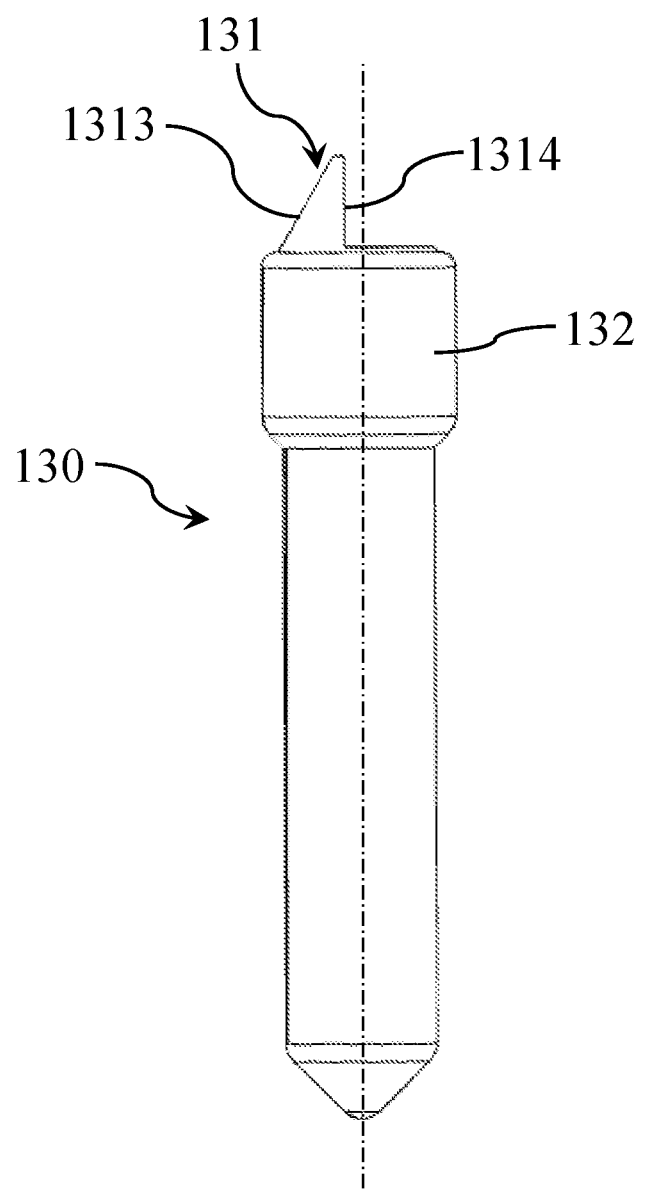
FIG. 7 is a schematic front view of the plunger shown in FIG. 6.
Figure 8:
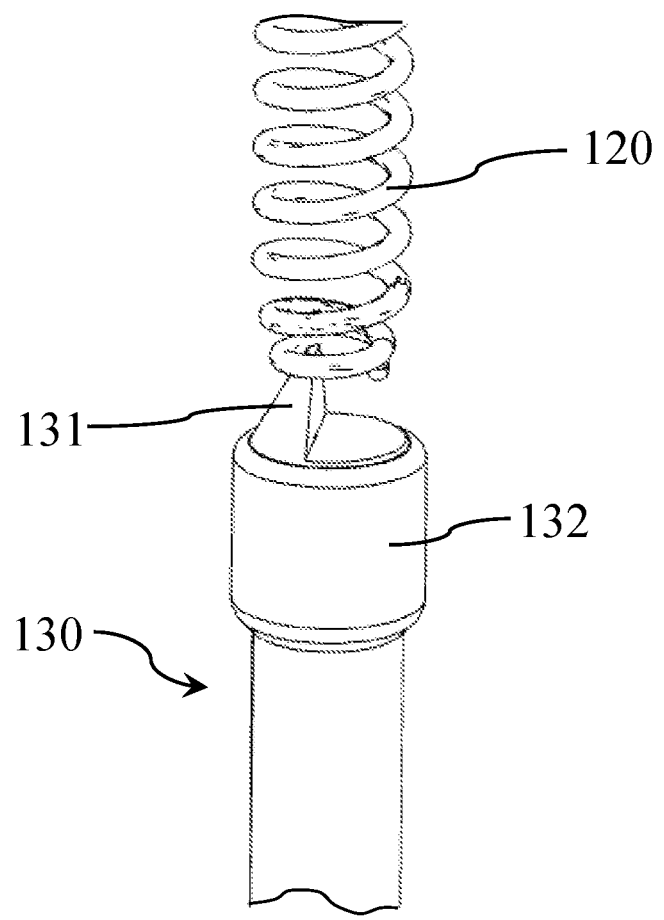
FIG. 8 is a schematic diagram illustrating the installation relationship between the plunger and the spring shown in FIG. 6.
Figure 9:
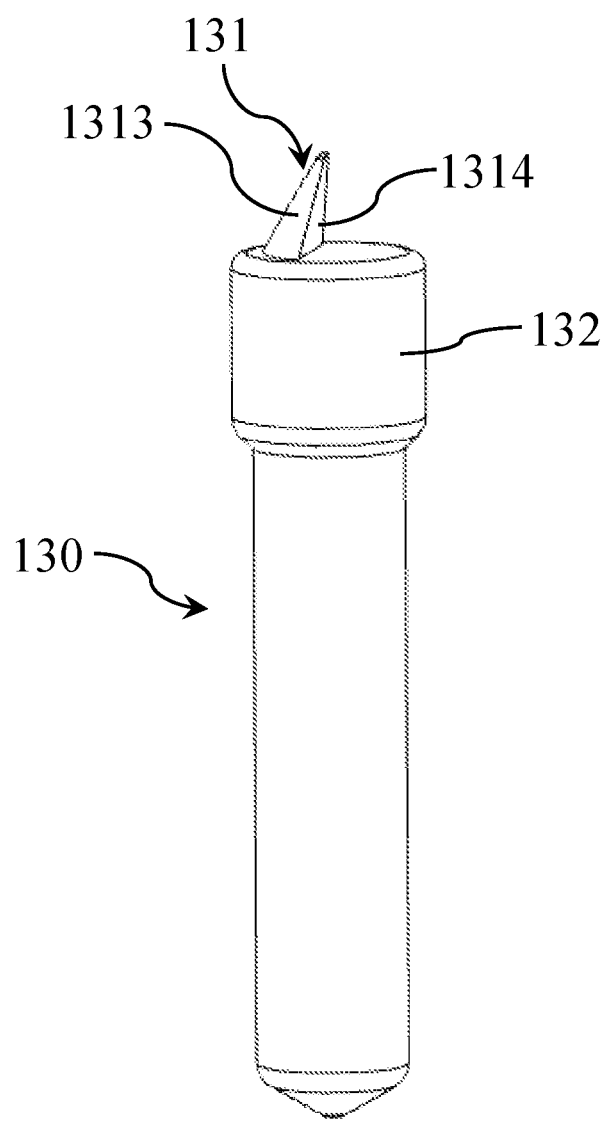
FIG. 9 is a schematic structural diagram of a plunger according to other embodiments of the present disclosure (the spring positioning part is another type of semicircular-like cone)
Figure 10:
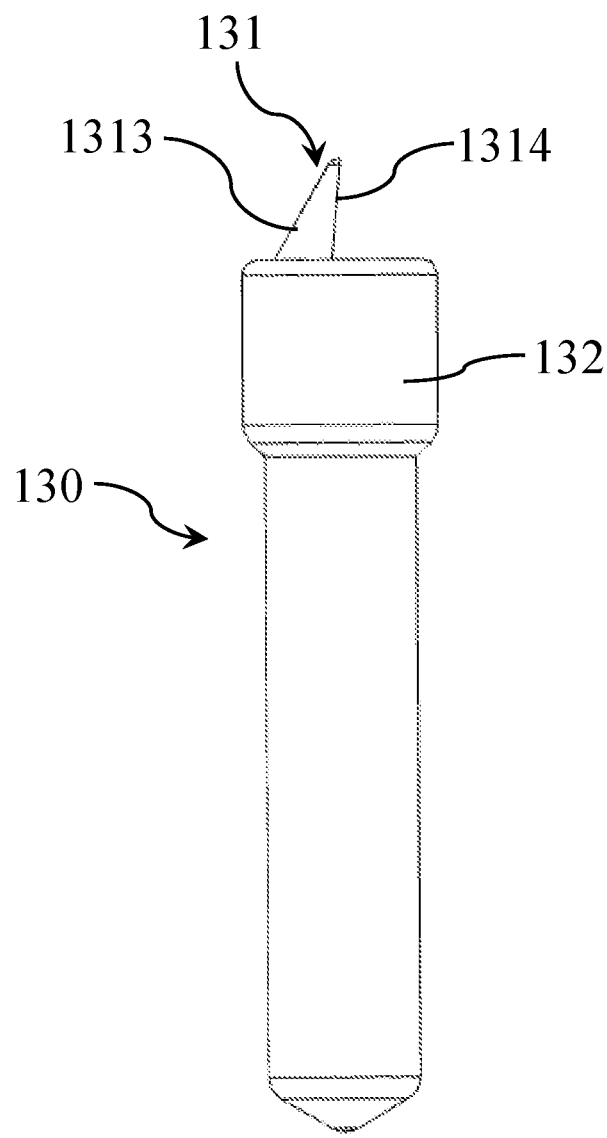
FIG. 10 is a schematic front view of the plunger shown in FIG. 9.
Figure 11:
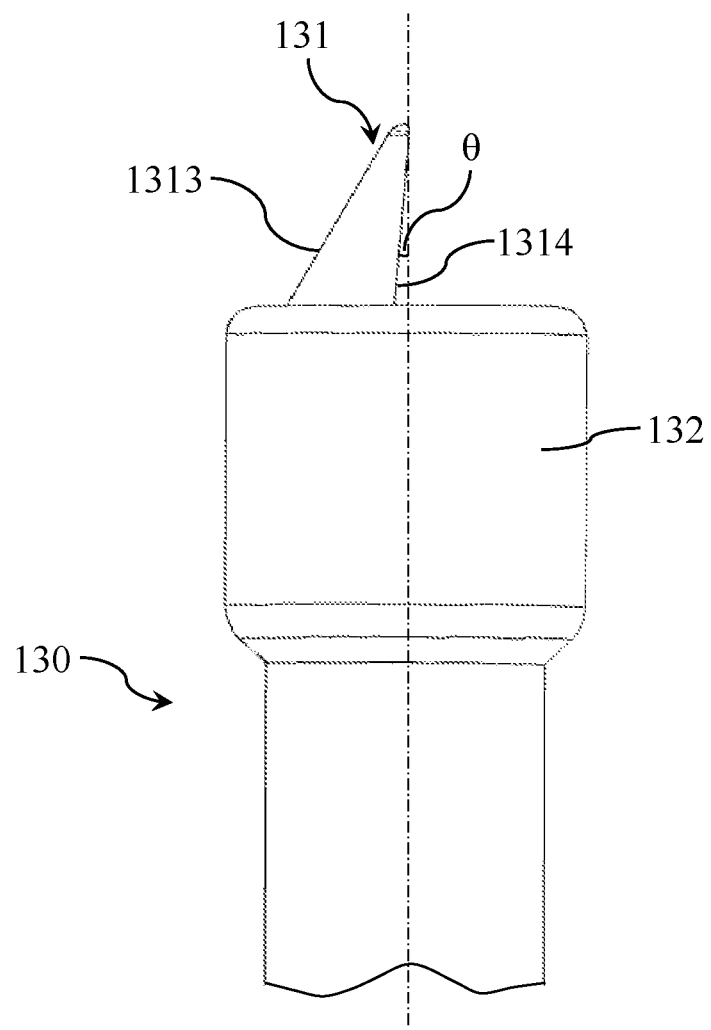
FIG. 11 is a partial enlarged schematic view of the plunger shown in FIG. 10.
Figure 12:
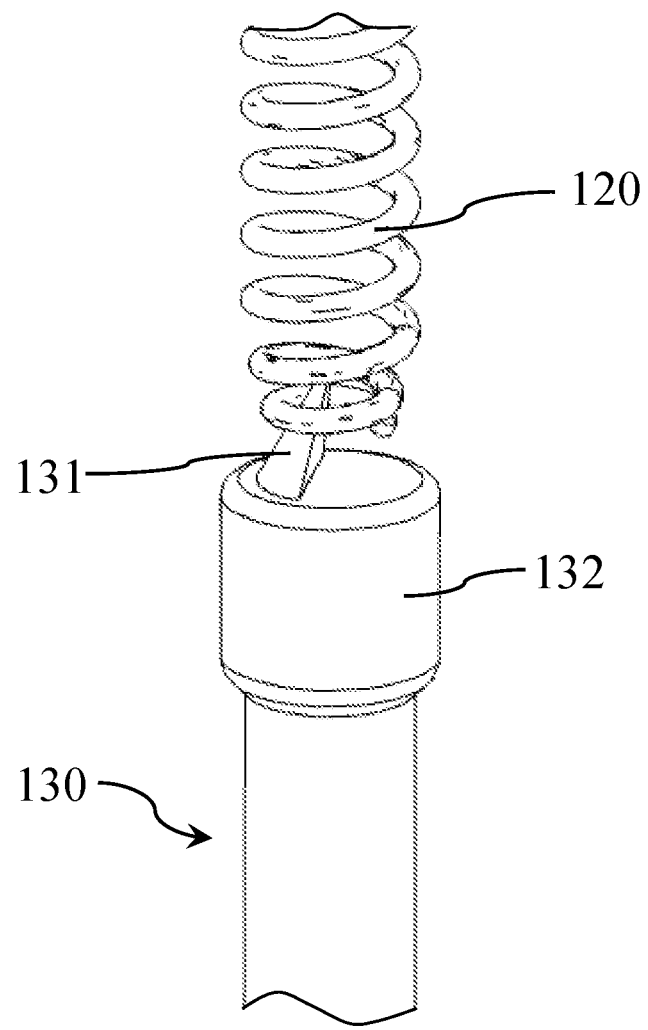
FIG. 12 is a schematic diagram illustrating the installation relationship between the plunger and the spring shown in FIG. 9.

In a specific example, as shown in FIGS. 6 to 8, the fourth side surface 1314 is planar and is parallel to the longitudinal section of the plunger 130, and the semicircular-like cone is a structure formed by cutting off more than ½ of the volume from a complete cone in a longitudinal direction. In this example, the fourth side surface 1314 is parallel to the longitudinal section of the plunger 130. It can be seen that the semicircular-like cone in this example can be obtained by cutting a complete cone along a plane parallel to the longitudinal section (which can be the longitudinal section of the cone, or the longitudinal section of the plunger 130), and the volume of the part cut off is greater than ½ of the volume of the complete cone. The inventors of the present disclosure have found through a large number of tests and verifications that setting the spring positioning part 131 as a semicircular-like cone in this example can significantly increase the energized contact load of the contact probe 100 (it can be increased more significantly when the spring positioning part 131 is a semicircular cone). For a contact probe 100 with a relatively small load, setting the spring positioning part 131 as a semicircular-like cone in this example can increase the energized contact load of the contact probe 100 to 2.3 times to 2.9 times (compared to the spring positioning part with a circular cone structure), and the energized contact load in this case has exceeded the aforementioned fixed value, which means that the occurrence of the resistance value of the contact probe 100 being greater than the allowable resistance value can be prevented in this case, that is, the resistance value of the contact probe 100 can be always kept below the allowable resistance value, thereby significantly improving the reliability of electrical testing of the socket.

In another specific example, as shown in FIGS. 9-12, the fourth side surface 1314 is planar, an included angle θ is formed between the plane where the fourth side surface 1314 is located and the longitudinal section of the plunger 130, the semicircular-like cone is a structure formed by cutting off more than ½ of the volume from a complete cone in a direction inclined with respect to the longitudinal direction (the direction in which the axis of the plunger 130 extends), wherein the included angle between the fourth side surface 1314 and an end surface of the plunger 130 is an acute angle. In this example, an included angle θ is formed between the fourth side surface 1314 and the longitudinal section of the plunger 130. It can be seen that the semicircular-like cone in this example can be obtained by cutting a complete cone along a plane that forms the included angle θ with the longitudinal section (which can be the longitudinal section of the cone, or the longitudinal section of the plunger 130), the included angle θ makes the volume of the part cut off greater than ½ of the volume of the complete cone, and the included angle between the plane and the end surface of the plunger 130 is an acute angle. The inventors of the present disclosure have found through a large number of tests and verifications that setting the spring positioning part 131 as a semicircular-like cone in this example can significantly increase the energized contact load of the contact probe 100 (it can be increased more significantly when the spring positioning part 131 is a semicircular cone). For a contact probe 100 with a relatively small load, setting the spring positioning part 131 as a semicircular-like cone in this example can increase the energized contact load of the contact probe 100 to 1.5 times to 2.7 times (compared to the spring positioning part with a circular cone structure). The energized contact load exceeds the aforementioned fixed value in this case, and therefore, the occurrence of the resistance value of the contact probe 100 being greater than the allowable resistance value can be greatly reduced.

Furthermore, the inventors of the present disclosure have also found that the aforementioned included angle θ also has an impact on the energized contact load of the contact probe 100. Specifically, when the aforementioned included angle θ is 5°, the energized contact load of the contact probe with a relatively small load is 1.5 times (compared to the spring positioning part with a circular cone structure), in this case the occurrence of the resistance value of the contact probe 100 being greater than the allowable resistance value can be greatly reduced.

In addition, the test further shows that the energized contact load of the contact probe 100 can be further increased by increasing the aforementioned included angle θ. When the aforementioned included angle θ is 10°, the energized contact load of the contact probe 100 with a relatively small load is 1.7 times to 2 times (compared to the spring positioning part with a circular cone structure), in this case the occurrence of the resistance value of the contact probe 100 being greater than the allowable resistance value can be prevented, that is, the resistance value of the contact probe 100 can be kept always below the allowable resistance value.

In addition, the test further shows that the energized contact load of the contact probe 100 can be further increased by increasing the aforementioned included angle θ. When the aforementioned included angle θ is 15°, the energized contact load of the contact probe 100 with a relatively small load is 2 times to 2.5 times (compared to the spring positioning part with a circular cone structure), in this case the occurrence of the resistance value of the contact probe 100 being greater than the allowable resistance value can be prevented, that is, the resistance value of the contact probe 100 can be kept always below the allowable resistance value.

In addition, the test further shows that the energized contact load of the contact probe 100 can be further increased by increasing the aforementioned included angle θ. When the aforementioned included angle θ is 20°, the energized contact load of the contact probe 100 with a relatively small load is 2.3 times to 2.5 times (compared to the spring positioning part with a circular cone structure), in this case the occurrence of the resistance value of the contact probe 100 being greater than the allowable resistance value can be prevented, that is, the resistance value of the contact probe 100 can be kept always below the allowable resistance value.

Figure 13:
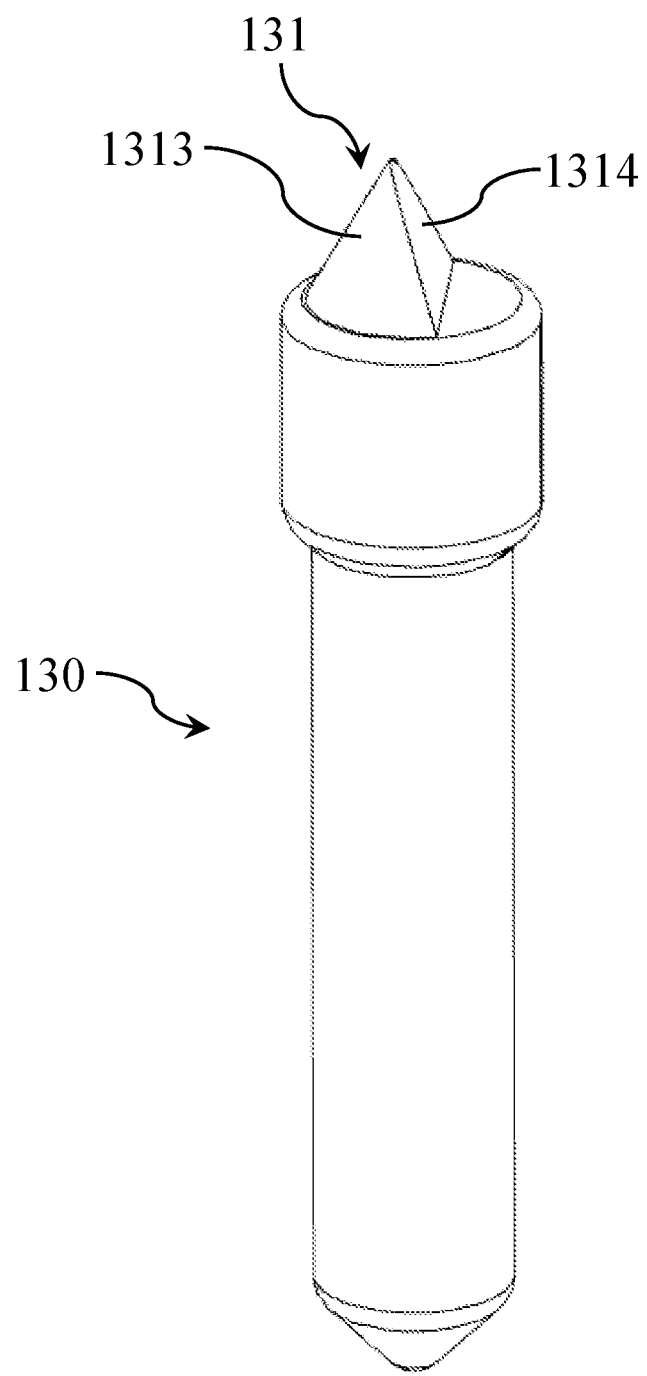
FIG. 13 is a schematic structural diagram of a plunger according to other embodiments of the present disclosure (the spring positioning part is yet another type of semicircular-like cone)
Figure 14:
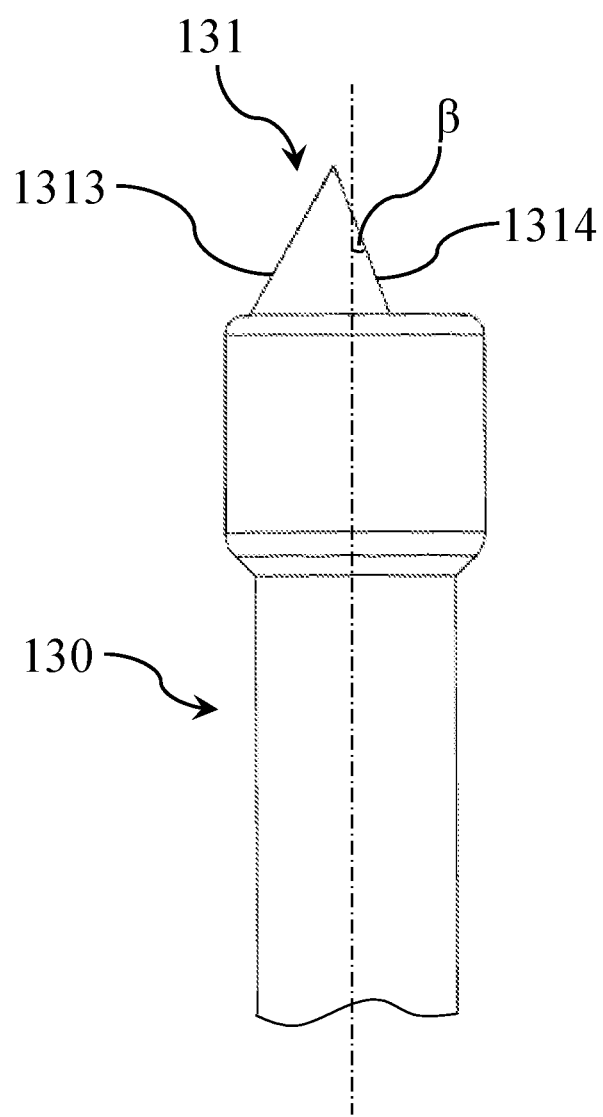
FIG. 14 is a schematic front view of the plunger shown in FIG. 13.

In another specific example, as shown in FIGS. 13 and 14, the fourth side surface 1314 is planar, an included angle β is formed between the plane where the fourth side surface 1314 is located and the longitudinal section of the plunger 130, the semicircular-like cone is a structure formed by cutting off less than ½ of the volume from a complete cone in a direction inclined with respect to the longitudinal direction (the direction in which the axis of the plunger 130 extends), and the included angle between the fourth side surface 1314 and an end surface of the plunger 130 is an obtuse angle. In this example, an included angle β is formed between the fourth side surface 1314 and the longitudinal section of the plunger 130. It can be seen that the semicircular-like cone in this example can be obtained by cutting a complete cone along a plane that forms the included angle β with the longitudinal section (which can be the longitudinal section of the cone, or the longitudinal section of the plunger 130), the included angle β makes the volume of the part cut off less than ½ of the volume of the complete cone, and the included angle between the plane and the end surface of the plunger 130 is an obtuse angle. The inventors of the present disclosure have found through a large number of tests and verifications that when the spring positioning part 131 is set as a semicircular-like cone in this example, the energized contact load of the contact probe 100 can be increased to some extent. For a contact probe 100 with a relatively small load, setting the spring positioning part 131 as a semicircular-like cone in this example can increase the energized contact load of the contact probe 100 to 1.1 times to 2.0 times (compared to the spring positioning part with a circular cone structure). In this case, the energized contact load significantly exceeds the above-mentioned fixed value, and the occurrence of the resistance value of the contact probe 100 being greater than the allowable resistance value can be reduced, thereby improving the reliability of the electrical testing of the socket.

Figure 15:
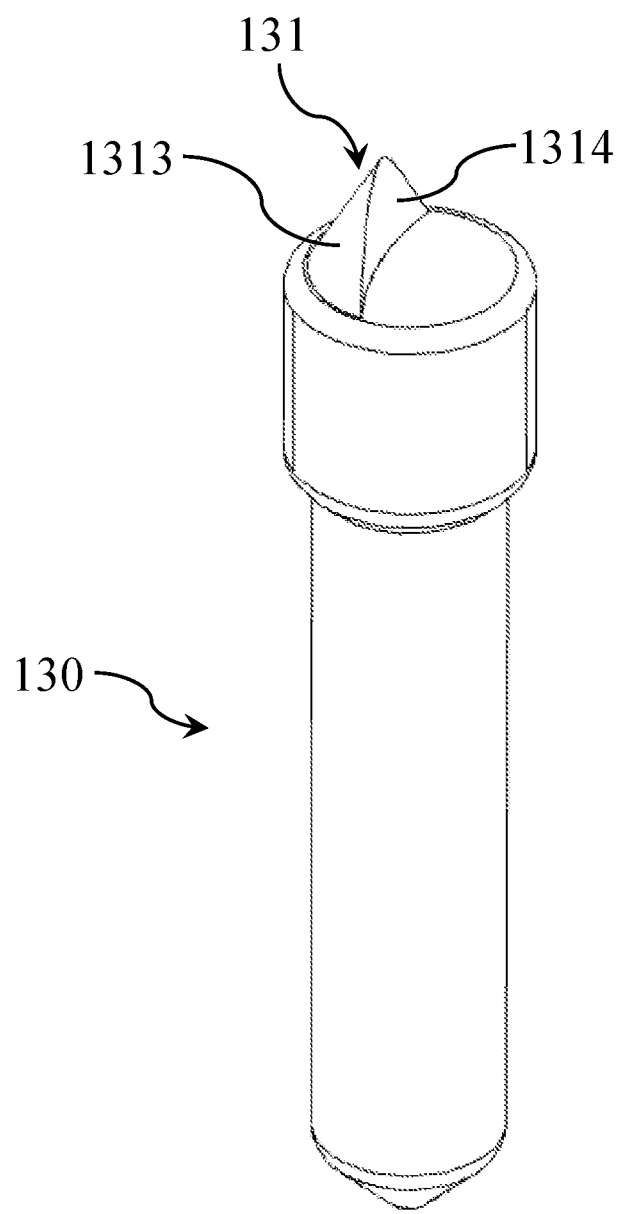
FIG. 15 is a schematic structural diagram of a plunger according to other embodiments of the present disclosure (the spring positioning part is yet another type of semicircular-like cone)
Figure 16:
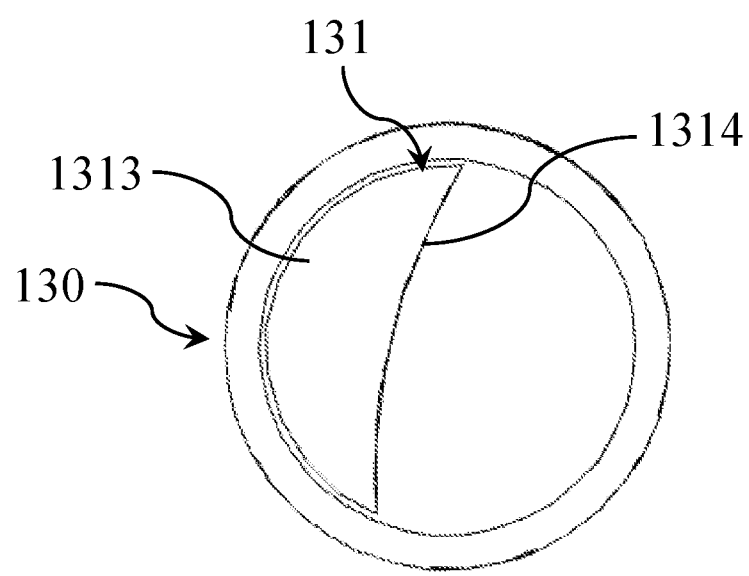
FIG. 16 is a schematic diagram of the plunger shown in FIG. 15 from a top view.
Figure 17:
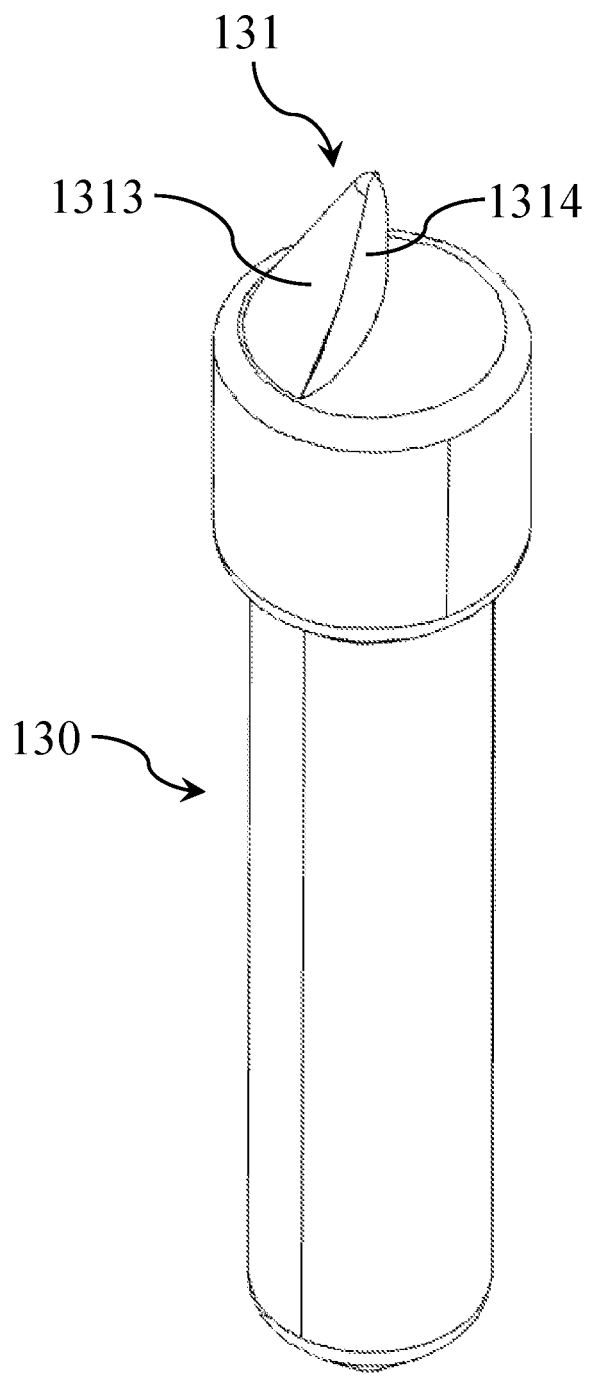
FIG. 17 is a schematic structural diagram of a plunger according to other embodiments of the present disclosure (the spring positioning part is yet another type of semicircular-like cone)
Figure 18:
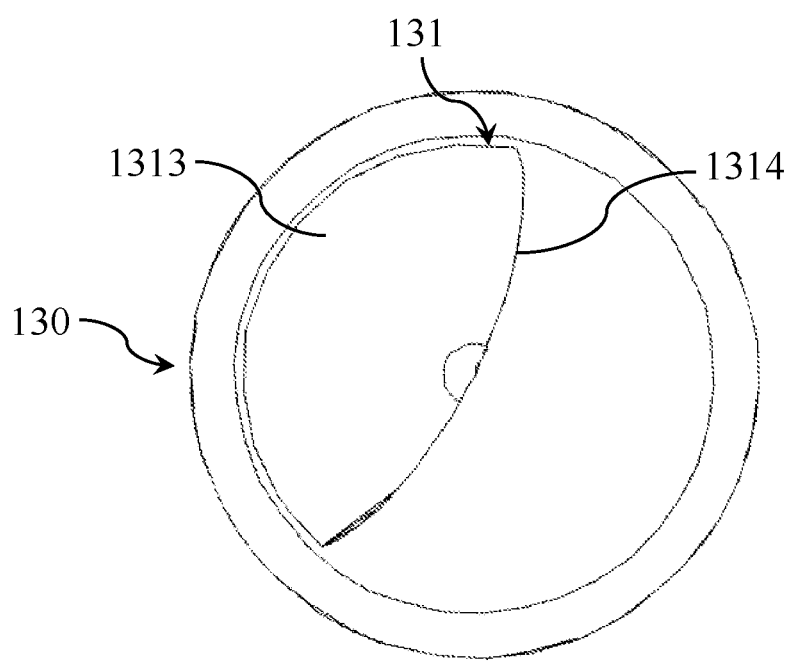
FIG. 18 is a schematic diagram of the plunger shown in FIG. 17 from a top view.

In another specific example, as shown in FIGS. 15-16, the fourth side surface 1314 is a spherical surface, a convex surface of which faces towards the third side surface, and the semicircular-like cone is a structure formed by cutting off more than ½ of the volume from a complete cone through the spherical surface. In this case, if viewed from a top view, the semicircular-like cone is in the shape of a "waning moon". The inventors of the present disclosure have found through a large number of tests and verifications that when the spring positioning part 131 is set as a semicircular-like cone in this example, the energized contact load of the contact probe 100 can be significantly increased. For a contact probe 100 with a relatively small load, setting the spring positioning part 131 as a semicircular-like cone in this example can increase the energized contact load of the contact probe 100 to 3.0 times to 4.4 times (compared to the spring positioning part with a circular cone structure). In this case, the energized contact load significantly exceeds the above-mentioned fixed value, and the occurrence of the resistance value of the contact probe 100 being greater than the allowable resistance value can be prevented, that is, the resistance value of the contact probe 100 can always be kept below the allowable resistance value. In another specific example, as shown in FIGS. 17-18, the fourth side surface 1314 is a spherical surface, a concave surface of which faces towards the third side surface, and the semicircular-like cone is a structure formed by cutting off more than ½ of the volume from a complete cone through the spherical surface. In this case, if viewed from a top view, the semicircular-like cone is in the shape of a "gibbous moon". The inventors of the present disclosure have found through a large number of tests and verifications that when the spring positioning part 131 is set as a semicircular-like cone in this example, the energized contact load of the contact probe 100 can be significantly increased. For a contact probe 100 with a relatively small load, setting the spring positioning part 131 as a semicircular-like cone in this example can increase the energized contact load of the contact probe 100 to 1.5 times to 1.7 times (compared to the spring positioning part with a circular cone structure). In this case, the energized contact load exceeds the aforementioned fixed value, and therefore the occurrence of the resistance value of the contact probe 100 being greater than the allowable resistance value can be greatly reduced.

In some embodiments of the present disclosure, as shown in FIGS. 19-24, the eccentric structure is a semicircular cylinder or a semicircular-like cylinder. The inventors have found through tests and verifications that when the eccentric structure is a semicircular cylinder or a semicircular-like cylinder, the energized contact load of the contact probe 100 will be increased.

Figure 19:
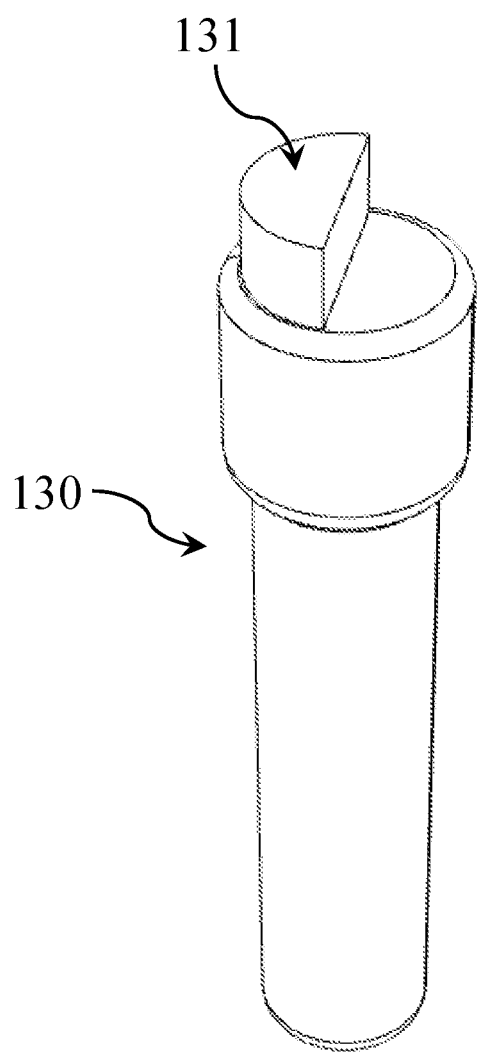
FIG. 19 is a schematic structural diagram of a plunger according to some embodiments of the present disclosure (the spring positioning part is a semicircular cylinder)
Figure 20:
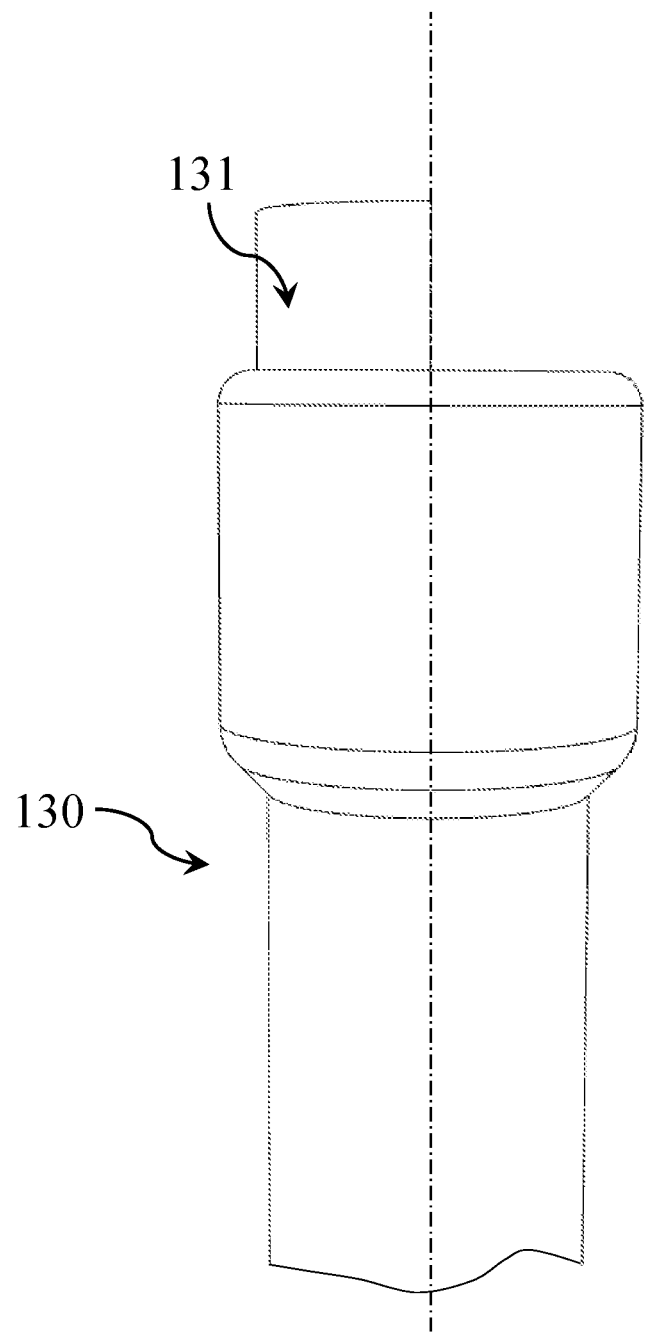
FIG. 20 is a schematic front view of the plunger shown in FIG. 19.

It can be understood that, as shown in FIGS. 19-20, the volume of the semicircular cylinder is exactly ½ of the volume of a complete cylinder, that is to say, it can be considered that the semicircular cylinder is a structure formed by cutting off a half of a complete cylinder along the longitudinal section (which may be the longitudinal section of the cylinder or the longitudinal section of the plunger 130). The inventors of the present disclosure have found through a large number of tests and verifications that when the spring positioning part 131 is a semicircular cylinder, the energized contact load of the contact probe 100 is increased to some extent. It is found through tests that for a contact probe 100 with a relatively small load, setting the spring positioning part 131 as a semicircular cylinder can increase the energized contact load of the contact probe 100 to 1.5 to 1.8 times (compared to the spring positioning part with a circular cone structure), in this case, the occurrence of the resistance value of the contact probe 100 being greater than the allowable resistance value can be greatly reduced.

Figure 21:
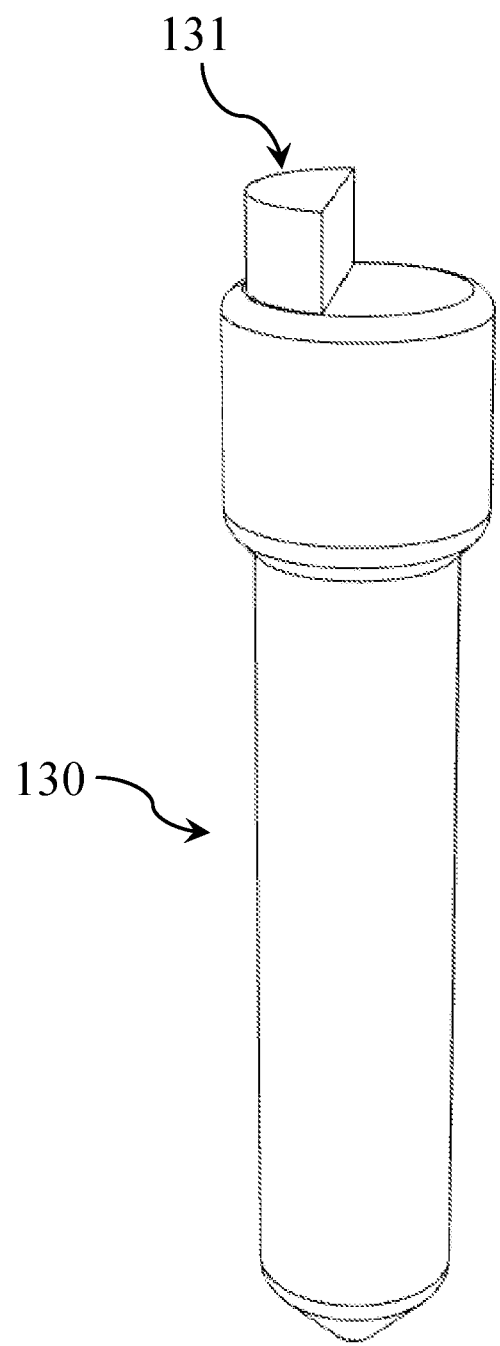
FIG. 21 is a schematic structural diagram of the plunger according to some embodiments of the present disclosure (the spring positioning part is a type of semicircular-like cylinder)
Figure 22:
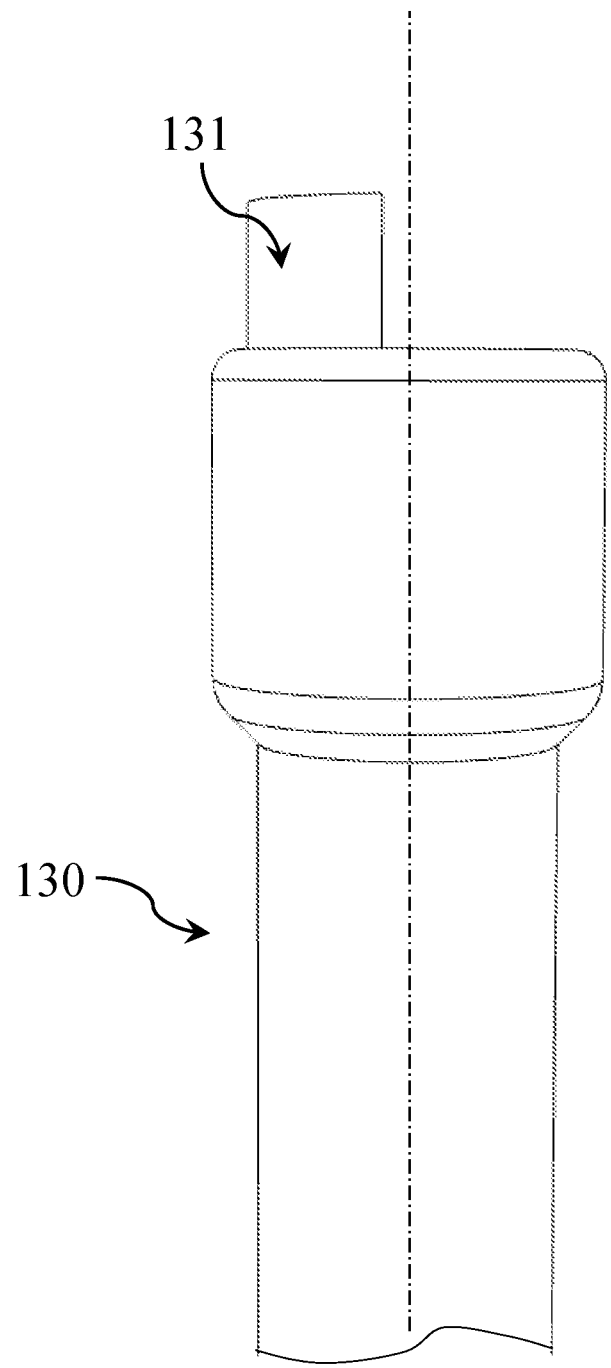
FIG. 22 is a schematic front view of the plunger shown in FIG. 21.

In some embodiments of the present disclosure, as shown in FIGS. 21-22, the semicircular-like cylinder is a structure formed by cutting off more than ½ of the volume from a complete cylinder in a longitudinal direction. The inventors of the present disclosure have found through a large number of tests and verifications that when the spring positioning part 131 is set as a semicircular-like cylinder in this example, the energized contact load of the contact probe 100 can be significantly increased. For a contact probe 100 with a relatively small load, setting the spring positioning part 131 as a semicircular-like cylinder in this example can increase the energized contact load of the contact probe 100 to 2.9 times to 3.4 times (compared to the spring positioning part with a circular cone structure). In this case, the energized contact load significantly exceeds the above-mentioned fixed value, and the occurrence of the resistance value of the contact probe 100 being greater than the allowable resistance value can be prevented, that is, the resistance value of the contact probe 100 can always be kept below the allowable resistance value.

Figure 23:
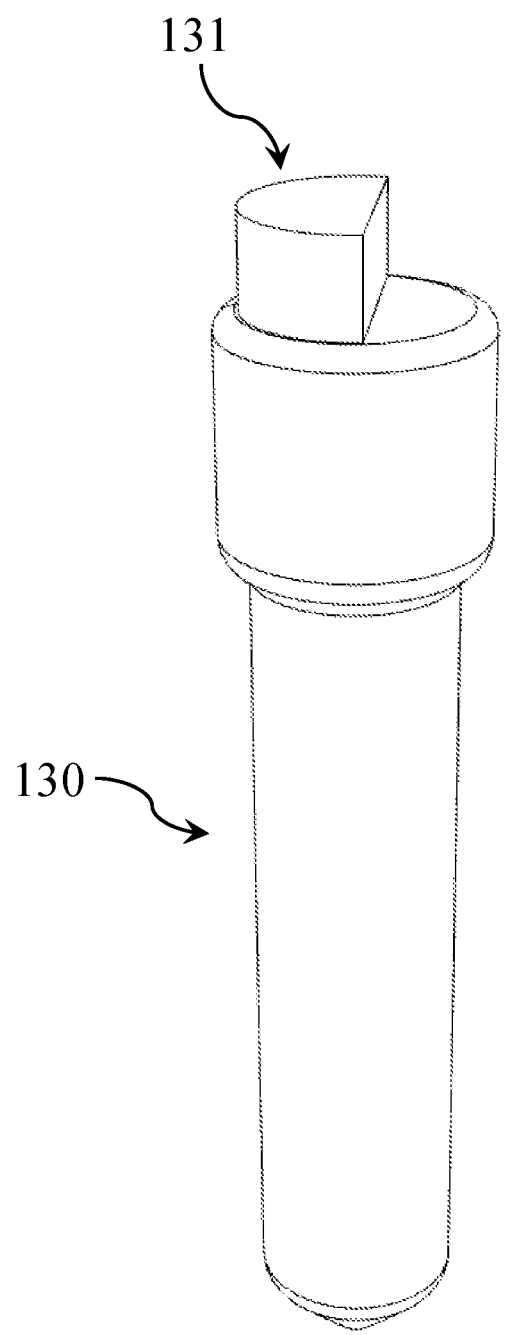
FIG. 23 is a schematic structural diagram of a plunger according to some embodiments of the present disclosure (the spring positioning part is another type of semicircular-like cylinder)
Figure 24:
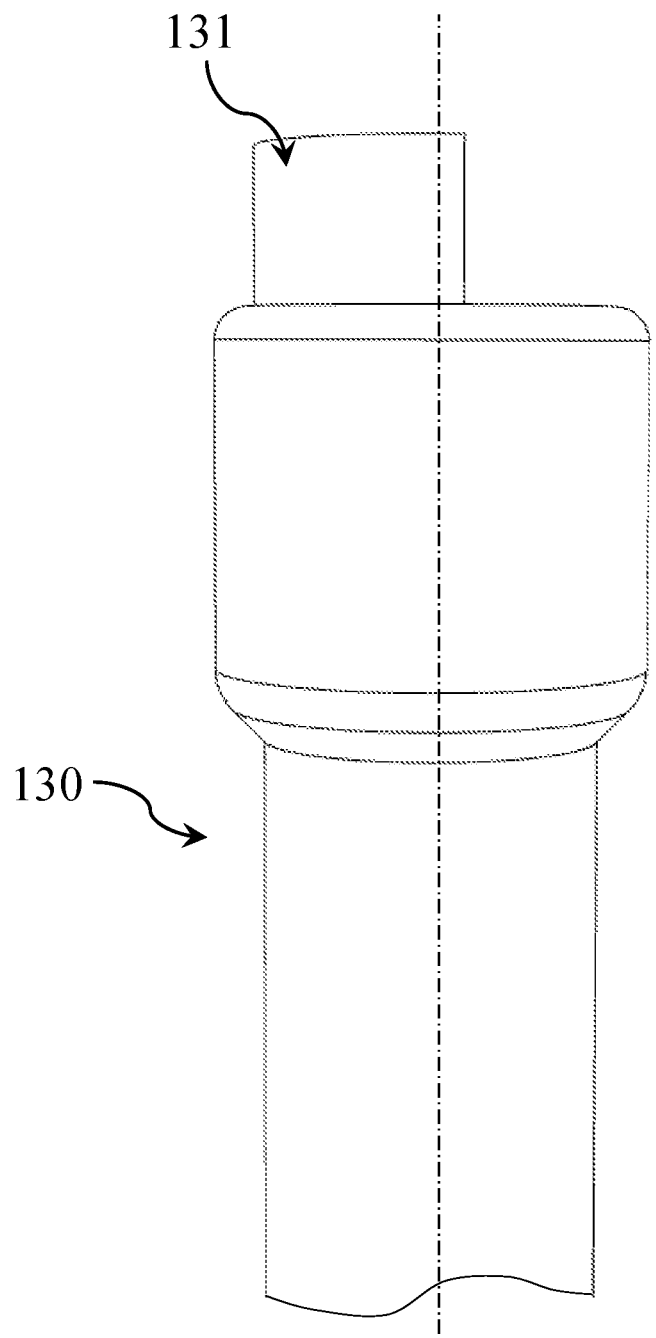
FIG. 24 is a schematic front view of the plunger shown in FIG. 23.
Figure 25:
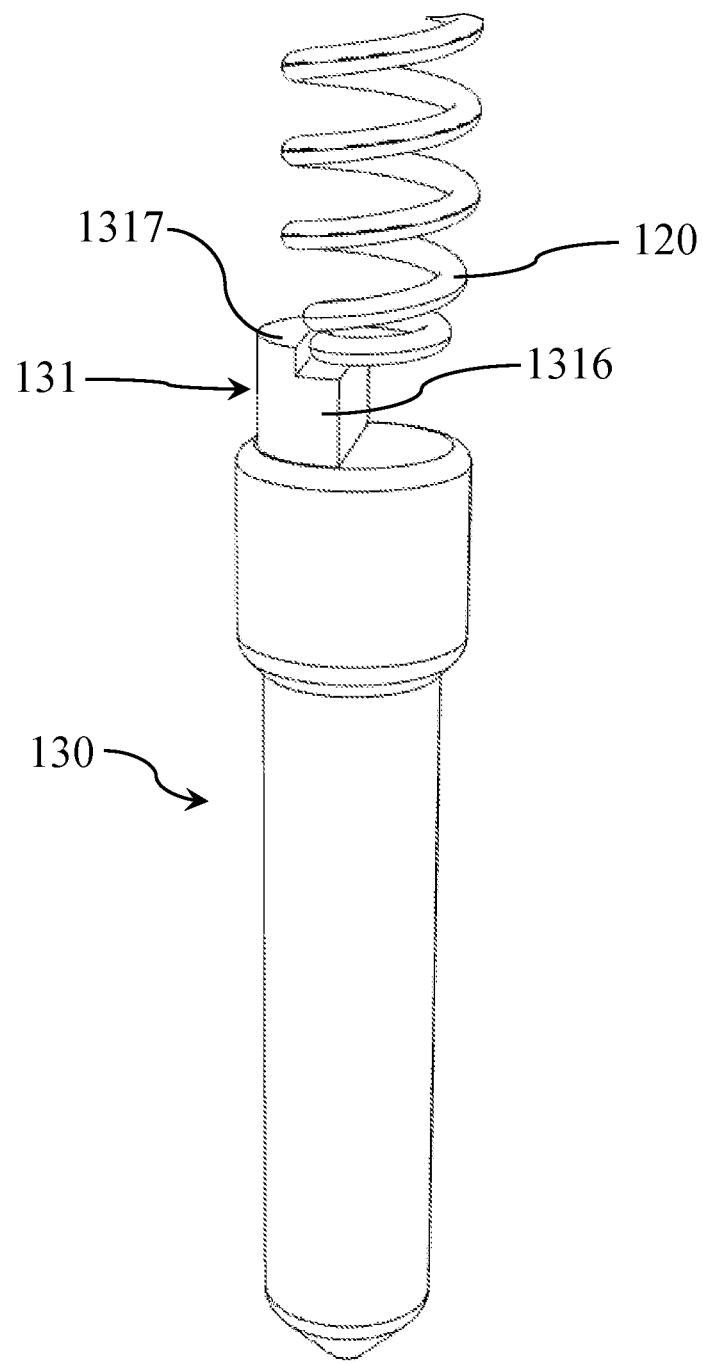
FIG. 25 is a schematic diagram illustrating the installation relationship between the plunger and the spring according to some embodiments of the present disclosure.
Figure 26:
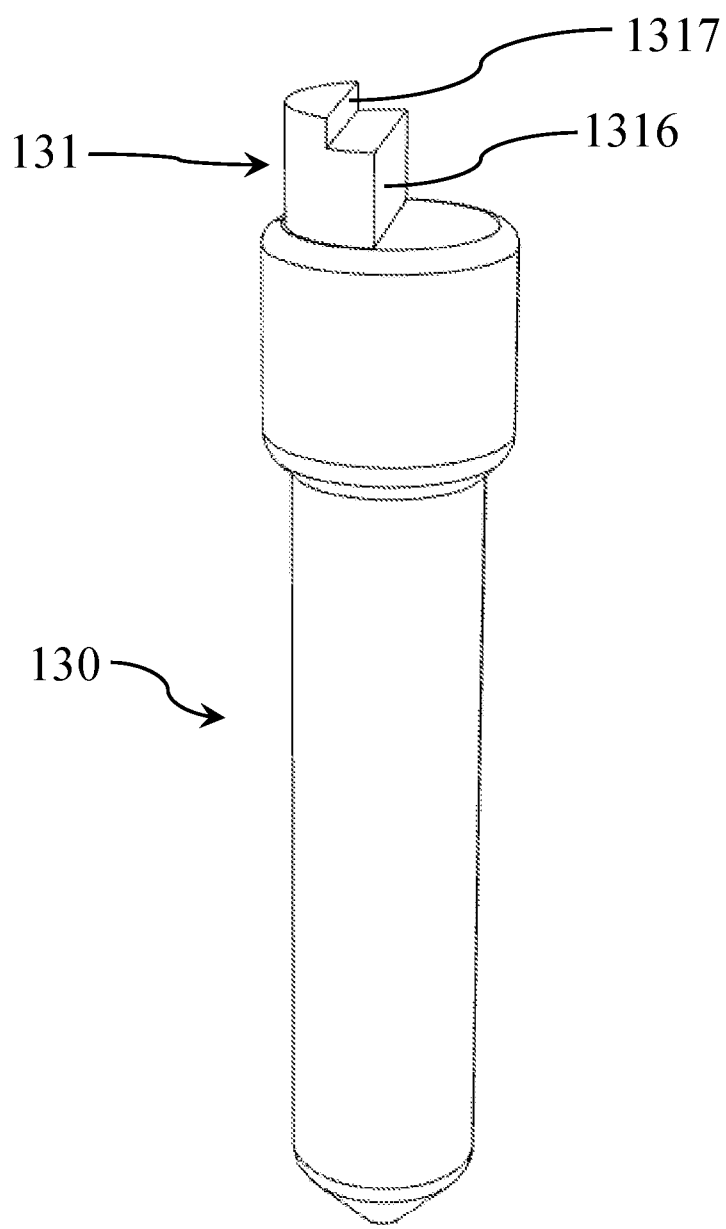
FIG. 26 is a schematic structural diagram of the plunger shown in FIG. 25 (a first segment of the spring positioning part is a semicircular cylinder, and a second segment is a semicircular-like cylinder)
Figure 27:
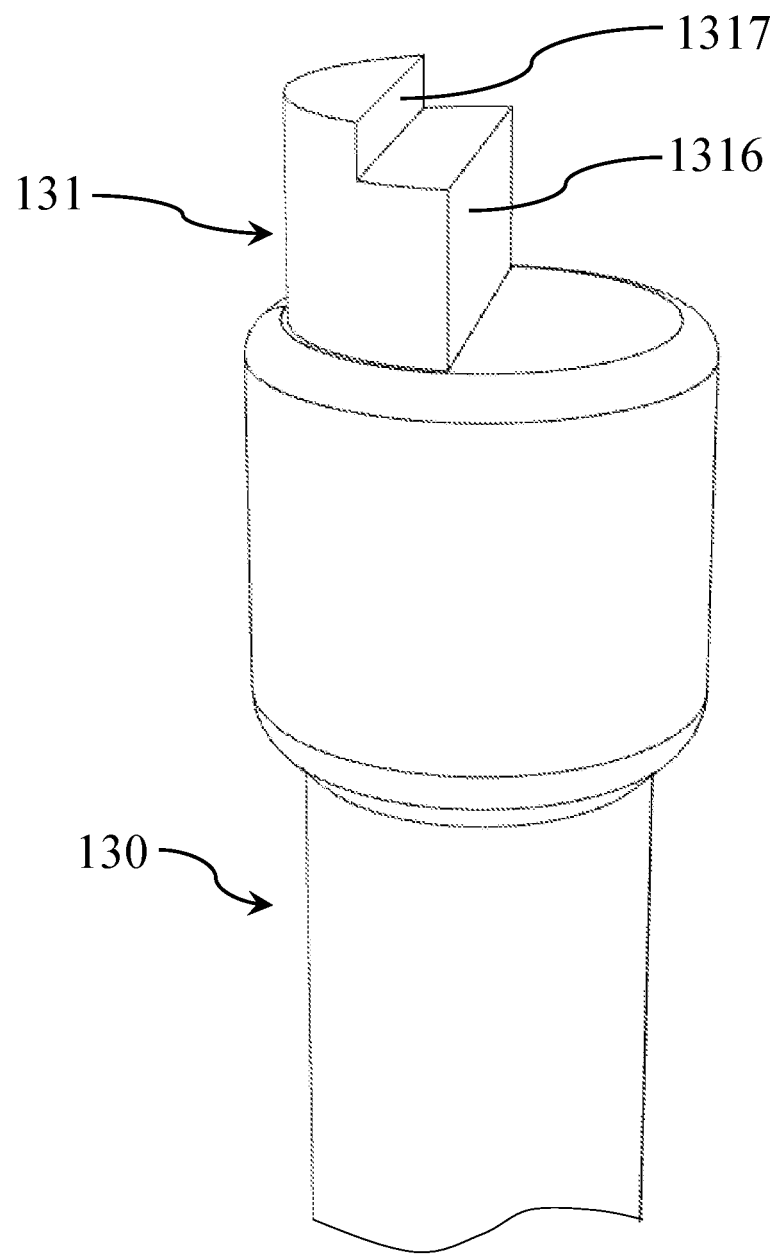
FIG. 27 is a partial enlarged schematic view of FIG. 26.

In other embodiments of the present disclosure, as shown in FIGS. 23-24, the semicircular-like cylinder is a structure formed by cutting off less than ½ of the volume from a complete cylinder in a longitudinal direction. For a contact probe 100 with a relatively small load, the energized contact load of the contact probe 100 can be increased to 1.05 times to 1.4 times depending on the volume cut off, and in this case, the occurrence of the resistance value of the contact probe 100 being greater than the allowable resistance value can be reduced. In some embodiments of the present disclosure, as shown in FIGS. 25-27, the eccentric structure comprises a first segment 1316 and a second segment 1317, wherein the first segment 1316 is a semicircular cylinder, and the second segment 1317 is a semicircular-like cylinder formed by cutting off more than ½ of the volume from a complete cylinder. The inventors of the present disclosure have found through a large number of tests and verifications that when the spring positioning part 131 is set as the eccentric structure in this embodiment, the energized contact load of the contact probe 100 can be significantly increased. For a contact probe 100 with a relatively small load, setting the spring positioning part 131 as a semicircular-like cylinder in this example can increase the energized contact load of the contact probe 100 to 2.3 times to 4.0 times (compared to the spring positioning part with a circular cone structure). In this case, the energized contact load significantly exceeds the above-mentioned fixed value, and the occurrence of the resistance value of the contact probe 100 being greater than the allowable resistance value can be prevented, that is, the resistance value of the contact probe 100 can always be kept below the allowable resistance value.

Figure 28:
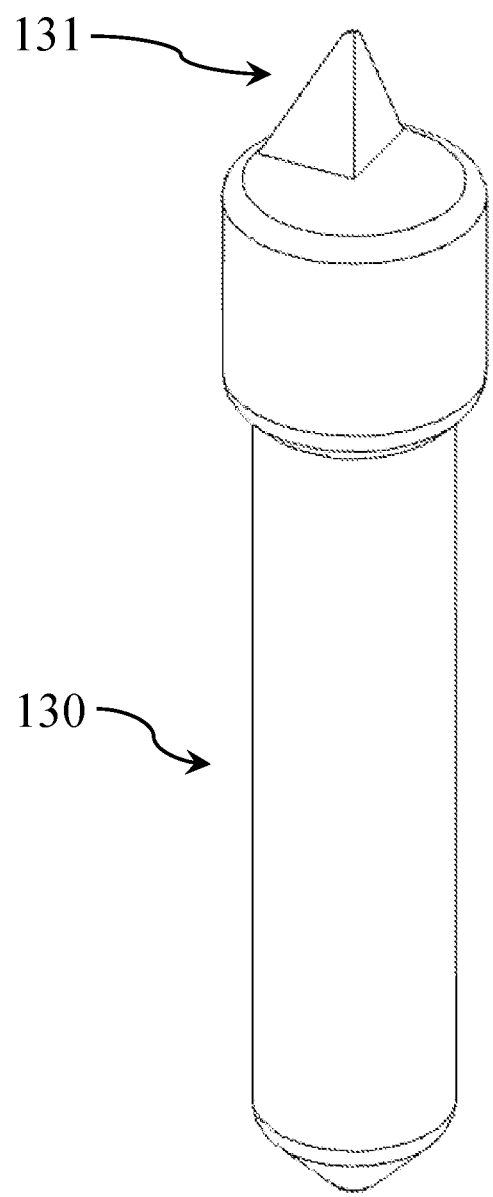
FIG. 28 is a schematic structural diagram of a plunger according to some embodiments of the present disclosure (the spring positioning part is a quarter cone)
Figure 29:
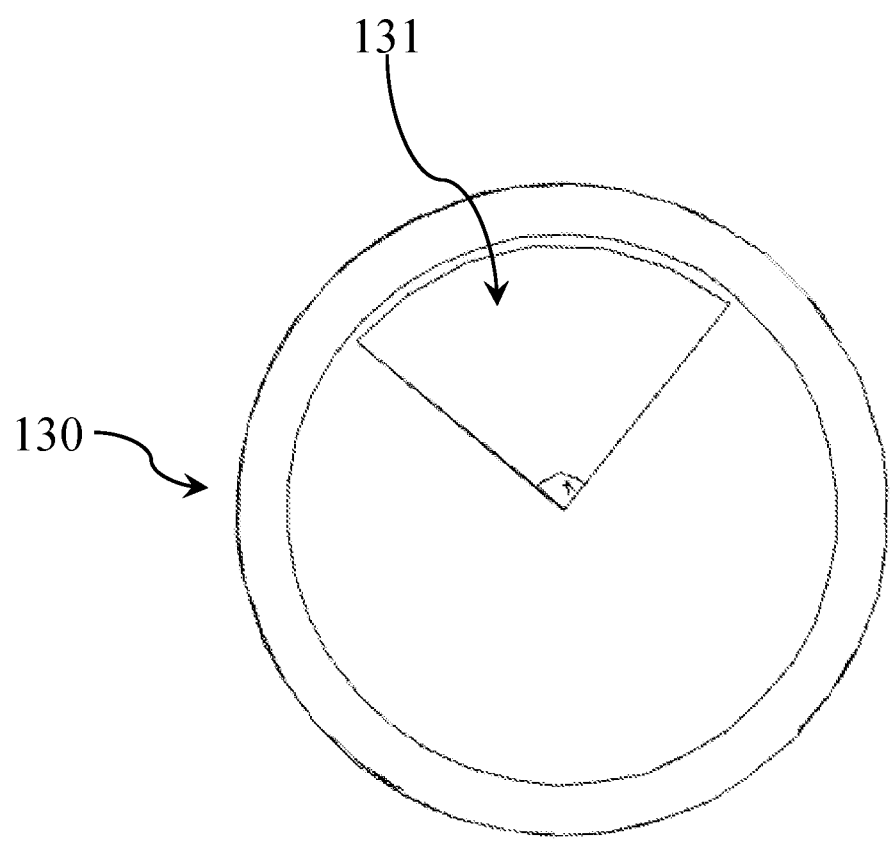
FIG. 29 is a schematic diagram of the plunger shown in FIG. 28 from a top view.

In some embodiments of the present disclosure, as shown in FIGS. 28-29, the eccentric structure is a quarter cone. The inventors of the present disclosure have found through a large number of tests and verifications that when the spring positioning part 131 is set as the eccentric structure in this embodiment, the energized contact load of the contact probe 100 can be significantly increased. For a contact probe 100 with a relatively small load, setting the spring positioning part 131 as a semicircular-like cylinder in this example can increase the energized contact load of the contact probe 100 to 2.4 times to 4.4 times (compared to the spring positioning part with a circular cone structure). In this case, the energized contact load significantly exceeds the above-mentioned fixed value, and the occurrence of the resistance value of the contact probe 100 being greater than the allowable resistance value can be prevented, that is, the resistance value of the contact probe 100 can always be kept below the allowable resistance value.

Figure 2:
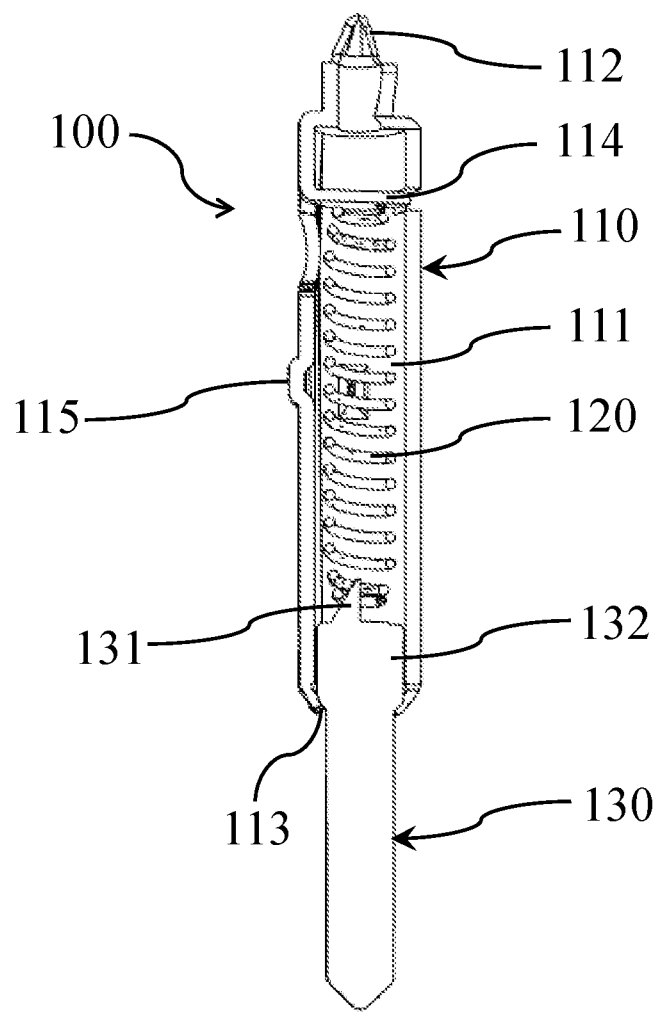
FIG. 2 is a schematic structural diagram illustrating the internal structure of a contact probe according to an embodiment of the present disclosure.

In some embodiments of the present disclosure, as shown in FIG. 2, a spring baffle 114 is provided on an inner wall of the receiving cavity 111, and the first end of the spring 120 abuts against the spring baffle 114, the second end of the spring 120 abuts against the spring positioning part 131. Therefore, under the action of the spring 120, the plunger 130 has a movement tendency to project out of the second end of the tubular structure 110. When the contact probe 100 is applied to a socket and the socket is in a working state, the first end of the tubular structure 110 is in contact with the terminal of the first electrical component, and the second end of the plunger 130 is in contact with the second electrical component 300, thereby establishing an electrical connection between the first electrical component and the second electrical component 300. In addition, under the action of the spring 120, a movement tendency away from each other is maintained between the plunger 130 and the tubular structure 110, so that the tubular structure 110 can be closely abutted against the terminal of the first electrical component, and the plunger 130 can be closely abutted against the second electrical component 300, so that the contact probe 100 will not be easily separated from the terminals of the first electrical component and/or the second electrical component 300, thereby improving the stability of the electrical connection between the first electrical component and the second electrical component 300.

In some embodiments of the present disclosure, the contact part 112 and the tubular structure 110 form an integral structure (as shown in FIGS. 1 and 2). In some other embodiments of the present disclosure, the contact part 112 may also be arranged separately from the tubular structure 110, that is, the contact part 112 is a separate component independent of the tubular structure 110.

In some embodiments of the present disclosure, the second end of the tubular structure 110 is formed with a through hole 113 for the plunger 130 to pass through, the first end of the plunger 130 is formed with an expanded part 132, and the outer diameter of the expanded part 132 is greater than the diameter of the through hole 113. In this embodiment, the first end of the plunger 130 is formed with an enlarged part 132, and the outer diameter of the expanded part 132 is larger than the diameter of the through hole 113, so that the expanded part 132 cannot freely enter and exit the through hole 113. In this way, the plunger 130 can be prevented from being disengaged from the through hole 113.

Figure 30:
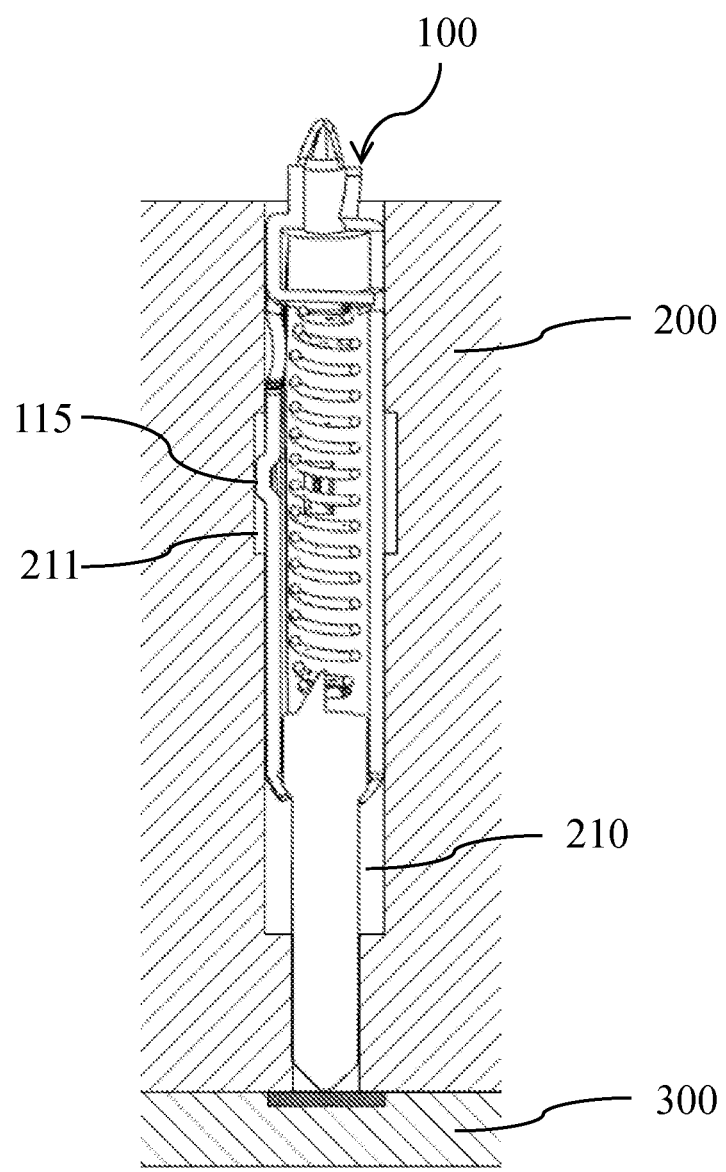
FIG. 30 is a schematic diagram of a socket according to an embodiment of the present disclosure.

As shown in FIG. 30, an embodiment in the second aspect of the present disclosure provides a socket for testing an electrical component. The socket includes a socket body 200 and a contact probe 100, wherein a probe receiving hole 210 is provided in the socket body 200, the contact probe 100 is the contact probe 100 in any one of the above-mentioned embodiments, and the contact probe 100 is provided in the probe receiving hole 210.

According to the socket for testing an electrical component according to the embodiment of the present disclosure, by means of setting the spring positioning part 131 of the contact probe 100 as an eccentric structure (e.g., a semicircular cone or semicircular-like cone, a semicircular cylinder or semicircular-like cylinder, etc.), the energized contact load of the contact probe 100 can be significantly increased, thereby reducing the occurrence of the resistance value of the contact probe 100 being greater than the allowable resistance value, and further improving the reliability of electrical testing of sockets.

In some embodiments of the present disclosure, a limiting flange 115 is formed on the outer surface of the tubular structure 110, and correspondingly, a limiting groove 211 is provided in the inner wall of the probe receiving hole 210, and the limiting flange 115 is limited in the limiting groove 211, so that the contact probe 100 is kept inside the probe receiving hole 210, thereby preventing the contact probe 100 from accidentally falling out of the probe receiving hole 210.

It should be noted that the relationship terms herein such as "first", "second", and the like are only used for distinguishing one entity or operation from another entity or operation, but do not necessarily require or imply that there is any actual relationship or order between these entities or operations. Moreover, the terms "include", "comprise" or any other variants thereof are intended to cover non-exclusive inclusions, so that processes, methods, articles or devices comprising a series of elements comprise not only those elements listed but also those not specifically listed or the elements intrinsic to these processes, methods, articles, or devices. Without further limitations, elements defined by the sentences "comprise(s) a." or "include(s) a." do not exclude that there are other identical elements in the processes, methods, articles, or devices which include these elements.

All the embodiments are described in corresponding ways, same or similar parts in each of the embodiments can be referred to one another, and the parts emphasized are differences to other embodiments.

The embodiments described above are merely preferred embodiments of the present disclosure, and not intended to limit the protect scope of the present disclosure. Any modifications, equivalents, improvements or the like within the spirit and principle of the application should be included in the scope of the application.

What is claimed is:

1. A contact probe comprising:
   a tubular structure inside which a receiving cavity is formed, wherein a contact part for contacting with a terminal of a first electrical component is provided at a first end of the tubular structure;
   a spring arranged in the receiving cavity;
   a plunger connected with the tubular structure in a slidable manner, wherein a first end of the plunger is provided with a spring positioning part, which abuts against the spring and is an eccentric structure arranged offset from a central axis of the plunger, a second end of the plunger projects from a second end of the tubular structure;
   wherein the eccentric structure is a semicircular cone or a semicircular-like cone; or
   wherein the eccentric structure is a semicircular cylinder or a semicircular-like cylinder, and the semicircular cylinder is a structure formed by cutting off a half of a complete cylinder along a longitudinal section thereof; or
   wherein the eccentric structure comprises a first segment and a second segment, wherein the first segment is a semicircular cylinder, and the second segment is a semicircular-like cylinder formed by cutting off more than ½ of a volume from a complete cylinder; or
   wherein the eccentric structure is a quarter cone.

2. The contact probe of claim 1, wherein the semicircular cone has a first side surface and a second side surface intersecting with the first side surface, wherein the first side surface is a conical surface, the second side surface is planar, and the second side surface coincides with a longitudinal section of the plunger.

3. The contact probe of claim 1, wherein the semicircular-like cone has a third side surface and a fourth side surface intersecting with the third side surface, wherein the third side surface is a conical surface, and the fourth side surface does not coincide with a longitudinal section of the plunger.

4. The contact probe of claim 3, wherein the fourth side surface is planar and is parallel to the longitudinal section of the plunger, and the semicircular-like cone is a structure formed by cutting off more than ½ of a volume from a complete cone in a longitudinal direction.

5. The contact probe of claim 3, wherein the fourth side surface is planar, an included angle is formed between a plane where the fourth side surface is located and the longitudinal section of the plunger, the semicircular-like cone is a structure formed by cutting off more than ½ of a volume from a complete cone in a direction inclined with respect to a longitudinal direction, and an included angle between the fourth side surface and an end surface of the plunger is an acute angle.

6. The contact probe of claim 5, wherein the included angle is greater than or equal to 5°.

7. The contact probe of claim 5, wherein the included angle is greater than or equal to 10°.

8. The contact probe of claim 3, wherein the fourth side surface is planar, an included angle is formed between a plane where the fourth side surface is located and the longitudinal section of the plunger, the semicircular-like cone is a structure formed by cutting off less than ½ of a volume from a complete cone in a direction inclined with respect to a longitudinal direction, and an included angle between the fourth side surface and an end surface of the plunger is an obtuse angle.

9. The contact probe of claim 3, wherein the fourth side surface is a spherical surface, a convex surface of which faces towards the third side surface, and the semicircular-like cone is a structure formed by cutting off more than ½ of a volume from a complete cone through the spherical surface.

10. The contact probe of claim 3, wherein the fourth side surface is a spherical surface, a concave surface of which faces towards the third side surface, and the semicircular-like cone is a structure formed by cutting off more than ½ of a volume from a complete cone through the spherical surface.

11. The contact probe of claim 1, wherein the semicircular-like cylinder is a structure formed by cutting off more than ½ of a volume from a complete cylinder in a longitudinal direction.

12. The contact probe of claim 1, wherein the semicircular-like cylinder is a structure formed by cutting off less than ½ of a volume from a complete cylinder in a longitudinal direction.

13. The contact probe of claim 1, wherein a spring baffle is provided on an inner wall of the receiving cavity, and a first end of the spring abuts against the spring baffle, a second end of the spring abuts against the spring positioning part.

14. The contact probe of claim 1, wherein the second end of the tubular structure is formed with a through hole for the plunger to pass through, the first end of the plunger is formed with an expanded part, and an outer diameter of the expanded part is greater than a diameter of the through hole.

15. A socket for testing an electrical component, comprising:
   a socket body, in which a probe receiving hole is provided;
   a contact probe, which is provided in the probe receiving hole;
   wherein the contact probe comprises:
   a tubular structure inside which a receiving cavity is formed, wherein a contact part for contacting with a terminal of a first electrical component is provided at a first end of the tubular structure;
   a spring arranged in the receiving cavity;
   a plunger connected with the tubular structure in a slidable manner, wherein a first end of the plunger is provided with a spring positioning part, which abuts against the spring and is an eccentric structure arranged offset from a central axis of the plunger, a second end of the plunger projects from a second end of the tubular structure;

wherein the eccentric structure is a semicircular cone or a semicircular-like cone; or wherein the eccentric structure is a semicircular cylinder or a semicircular-like cylinder, and the semicircular cylinder is a structure formed by cutting off a half of a complete cylinder along a longitudinal section thereof; or wherein the eccentric structure comprises a first segment and a second segment, wherein the first segment is a semicircular cylinder, and the second segment is a semicircular-like cylinder formed by cutting off more than ½ of a volume from a complete cylinder; or wherein the eccentric structure is a quarter cone.

* * * * *